US008466450B2

(12) United States Patent
Shimamune et al.

(10) Patent No.: US 8,466,450 B2
(45) Date of Patent: *Jun. 18, 2013

(54) SEMICONDUCTOR DEVICE AND FABRICATION METHOD THEREOF

(75) Inventors: Yosuke Shimamune, Kawasaki (JP); Akira Katakami, Kawasaki (JP); Akiyoshi Hatada, Kawasaki (JP); Masashi Shima, Kawasaki (JP); Naoyoshi Tamura, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 52 days.

This patent is subject to a terminal disclaimer.

(21) Appl. No.: 12/846,162

(22) Filed: Jul. 29, 2010

(65) Prior Publication Data
US 2010/0301394 A1    Dec. 2, 2010

Related U.S. Application Data

(62) Division of application No. 11/107,945, filed on Apr. 18, 2005, now Pat. No. 7,791,064.

(30) Foreign Application Priority Data

Dec. 28, 2004    (JP) .................................. 2004-380619

(51) Int. Cl.
*H01L 29/06*      (2006.01)
*H01L 31/0328*    (2006.01)
*H01L 31/0336*    (2006.01)
*H01L 31/072*     (2006.01)
*H01L 31/109*     (2006.01)

(52) U.S. Cl.
USPC .............................. 257/19; 257/65; 257/616

(58) Field of Classification Search
USPC .............................................. 257/19, 65, 616
See application file for complete search history.

(56) References Cited

U.S. PATENT DOCUMENTS 5,710,450 A * 1/1998 Chau et al. ............... 257/344
6,165,826 A * 12/2000 Chau et al. ............... 438/231
(Continued)

FOREIGN PATENT DOCUMENTS

JP    63-153863 A    6/1988
JP    2004-31753 A   1/2004

OTHER PUBLICATIONS

European Search Report dated Aug. 2, 2007, issued in corresponding European Patent Application No. 05007947.4-1235.

(Continued)

*Primary Examiner* — Thien F Tran
(74) *Attorney, Agent, or Firm* — Westerman, Hattori, Daniels & Adrian, LLP

(57) ABSTRACT

A semiconductor device includes a gate electrode formed on a silicon substrate via a gate insulation film in correspondence to a channel region, source and drain regions of a p-type diffusion region formed in the silicon substrate at respective outer sides of sidewall insulation films of the gate electrode, and a pair of SiGe mixed crystal regions formed in the silicon substrate at respective outer sides of the sidewall insulation films in epitaxial relationship to the silicon substrate, the SiGe mixed crystal regions being defined by respective sidewall surfaces facing with each other, wherein, in each of the SiGe mixed crystal regions, the sidewall surface is defined by a plurality of facets forming respective, mutually different angles with respect to a principal surface of the silicon substrate.

7 Claims, 16 Drawing Sheets

U.S. PATENT DOCUMENTS

| | | | |
|---|---|---|---|
| 6,221,131 | B1 | 4/2001 | Behling et al. |
| 6,621,131 | B2 | 9/2003 | Murthy et al. |
| 6,777,759 | B1 * | 8/2004 | Chau et al. ............ 257/377 |
| 2003/0104645 | A1 | 6/2003 | Weon et al. |
| 2005/0090082 | A1 * | 4/2005 | Sridhar et al. ............ 438/508 |
| 2005/0285203 | A1 | 12/2005 | Fukutome et al. |
| 2006/0289856 | A1 | 12/2006 | Shimamune et al. |

OTHER PUBLICATIONS

T. Ghani et al., "A 90nm High Volume Manufacturing Logic Technology Featuring Novel 45nm Gate Length Strained Silicon CMOS Transistors", International Electron Devices Meeting 2003, IEDM. Technical Digest, Washington, DC, Dec. 8-10, 2003, pp. 978-980, New York, NY.

Japanese Office Action dated Jul. 15, 2008, issued in corresponding Japanese Patent Application No. 2004-380619.

R. Loo et al, "A New Technique to Fabricate Ultra-Shallow-Junctions, Combining in Situ Vapor HCl Etching and in Situ Doped Epitaxial SiGe Re-Growth", Applied Surface Science, Mar. 15, 2004, pp. 63-67, vol. 2234, No. 1-4, Elsevier, Amsterdam, NL.

T. Matsuda et al., "Electrical Characteristics of Oo/+-45o/90o-Orientation CMOSFET With Source/Drain Fabricated by Various Ion-Implantation Methods", IEEE Transactions on Electron Devices, Apr. 4, 1999, pp. 703-711, vol. 46, No. 4, IEEE Service Center, Piscataway, NJ.

V. Moroz et al., "Analyzing Strained-Silicon Options for Stress-Engineering Transistors", Solid State Technology , Jul. 2004, pp. 49-52, vol. 47, No. 7, Pennwell Coporation, Tulsa, OK.

Scott E. Thompson et al., A 90nm Logic Technology Featuring Strained-Silicon, IEEE Transactions on Electron Devices, Nov. 2005, pp. 1790-1797, vol. 51, No. 11.

R. Loo et al., "A New Technique to Fabricate Ultra-Shallow-Junctions, Combining in Situ Vapor HCl Etching and in Situ Doped Epitaxial SiGe Re-Growth", Applied Surface Science, Mar. 15, 2004, pp. 63-67, vol. 224, No. 1-4, Elsevier, Amsterdam, NL.

V. Moroz et al., "Analyzing Strained-Silicon Options for Stress-Engineering Transistors", Solid State Technology, Jul. 2004, pp. 49-50, 52, vol. 47, No. 7, Pennwell Corporation, Tulsa, OK.

Scott E. Thompson et al., A 90nm Logic Technology Featuring Strained-Silicon, IEEE Transactions on Electron Devices, Nov. 2004, pp. 1790-1797, vol. 51, No. 11.

* cited by examiner

SEMICONDUCTOR DEVICE AND FABRICATION METHOD THEREOF

CROSS-REFERENCE TO RELATED APPLICATION

The present application is a Divisional of application Ser. No. 11/107,945 filed Apr. 18, 2005 which is based on Japanese priority application No. 2004-380619 filed on Dec. 28, 2004, the entire contents of which are hereby incorporated by reference.

BACKGROUND OF THE INVENTION

The present invention generally relates to semiconductor devices and more particularly to a semiconductor device having improved operational speed as a result of stressing and the fabrication process thereof.

With progress in the art of device miniaturization, it is now possible to fabricate ultrafine and ultra high-speed semiconductor devices having a gate length of 100 nm or less.

In such ultrafine and ultra high-speed transistors, the area of the channel region right underneath the gate electrode is reduced as compared with conventional semiconductor devices, and the mobility of electrons or holes traveling through the channel region is influenced heavily by the stress applied to such a channel region.

Thus, there are various attempts made for improving the operational speed of the semiconductor device by optimizing the stress applied to such a channel region.

In semiconductor devices that use a silicon substrate as a channel region, the mobility of holes is generally smaller than the mobility of electrons, and thus, it is particularly important to improve the operational speed of p-channel MOS transistors, in which holes are used for the carriers, in the designing of semiconductor integrated circuits.

With such p-channel MOS transistors, it is known that the mobility of carriers is improved by applying a uniaxial compressive stress to the channel region, and there is a proposal to use the construction of FIG. 1 as the means of applying the compressive stress to the channel region.

Referring to FIG. 1, there is formed a gate electrode 3 on a silicon substrate 1 via a gate insulation film 2, and p-type diffusion regions 1a and 1b are formed in the silicon substrate 1 at both lateral sides of the gate electrode 3 so as to define the channel region. Further, sidewall insulation films 3A and 3B are formed on the sidewall surfaces of the gate electrode 3 so as to cover also a surface part of the silicon substrate 1.

Thereby, the diffusion regions 1a and 1b function respectively as a source extension region and a drain extension region of the MOS transistor, and the flow of the holes transported through the channel region right underneath the gate electrode 3 from the diffusion region 1a to the diffusion region 1b is controlled by the gate voltage applied to the gate electrode 3.

Further, there are formed SiGe mixed crystal regions 1A and 1B in the silicon substrate 1 in the construction of FIG. 1 at respective outer sides of the sidewall insulation films 3A and 3B with epitaxial relationship with the silicon substrate 1, and p-type source and drain regions are formed in the SiGe mixed crystal regions 1A and 1B respectively in continuation from the diffusion region 1a and the diffusion region 1b.

Because the SiGe mixed crystal regions 1A and 1B have a larger lattice constant larger than that of the silicon substrate 1 in the MOS transistor of the construction of FIG. 1, the SiGe mixed crystal regions 1A and 1B are applied with a compressive stress shown in FIG. 1 by an arrow a, and as a result, the SiGe mixed crystal regions 1A and 1B undergo deformation in the direction generally perpendicular to the surface of the silicon substrate 1 as shown by an arrow b.

Because the SiGe mixed crystal regions 1A and 1B are thus formed epitaxially on the silicon substrate 1, such a deformation of the SiGe mixed crystal regions 1A and 1B represented by the arrow b induces a corresponding deformation in the channel region of the silicon substrate as represented by an arrow c, while such a deformation in the channel region induces a uniaxial compressive stress in the channel region as represented by an arrow d.

As a result of such a uniaxial compressive stress applied to the channel region of the MOS transistor of FIG. 1, the symmetry of the Si crystal constituting the channel region is locally modulated, and as a result of such local modulation of the symmetry, degeneration of heavy holes and light holes in the valence band is resolved. Thereby, there is caused increase of hole mobility in the channel region, leading to improvement of operational speed of the transistor.

It should be noted that such increase of hole mobility caused in the channel region by locally induced stress appears particularly conspicuously in the ultrafine semiconductor devices having a gate length of 100 nm or less.

REFERENCES (Patent Reference 1) U.S. Pat. No. 6,621,131
(Patent Reference 2) Japanese Laid-Open Patent Application 2004-31753
(Non-Patent Reference 1) Thompson, S. E., et al., IEEE Transactions on Electron Devices, vol. 51, No. 11, November, 2004, pp. 1790-1797

SUMMARY OF THE INVENTION

FIG. 2 shows the construction of a p-channel MOS transistor based on such a principle and described in Non-Patent Reference 1. In the drawing, those parts corresponding to the parts described previously are designated by the same reference numerals and the description thereof will be omitted.

Referring to FIG. 2, the SiGe mixed crystal regions 1A and 1B are formed epitaxially so as to fill the respective trenches formed in the silicon substrate 1 up to the level higher than the interface between the silicon substrate 1 and the gate electrode 2 represented in the drawing by a dotted line L, Further, it should be noted that the mutually facing side surfaces 1As and 1Bs of the SiGe mixed crystal regions 1A and 1B are formed to have a curved shape such that the distance between the SiGe mixed crystal regions 1A and 1B increases continuously in the downward direction of the silicon substrate 1 from the lower surface of the gate insulation film 2.

Further, in the conventional construction of FIG. 2 in which the SiGe mixed crystal regions 1A and 1B grown to the level higher than the foregoing level L are formed directly with a silicide layer 4. A similar silicide layer 4 is formed also on the polysilicon gate electrode 3.

Further, in Non-Patent Reference 1 corresponding to the MOS transistor of FIG. 2, the use of a SiGe mixed crystal having the composition of $Si_{0.83}Ge_{0.17}$ is disclosed for the SiGe mixed crystal regions 1A and 1B. Further, the foregoing Non-Patent Reference 1 discloses the Ge concentration of 15 atomic percent for the SiGe mixed crystal regions 1A and 1B. Thereby, it is disclosed that epitaxy will be lost when the Ge concentration exceeds the foregoing concentration of 20 atomic percent.

On the other hand, it is thought that the operational speed of the p-channel MOS transistor would be increased further when the uniaxial compressive stress in the channel region is increased further in such a conventional p-channel MOS transistor.

Further, it is noted that, in the conventional art of Patent Reference 1, the epitaxial regrowth process the SiGe mixed crystal regions 1A and 1B is conducted at the temperature of 740° C., while the use of the temperature exceeding 650° C. would cause unwanted re-distribution of the impurity elements in the diffusion regions 1*a* and 1*b* or 1*c* and 1*d*, and it becomes difficult to achieve the desired operational characteristics of the p-channel MOS transistor.

Further, it is noted that the conventional p-channel MOS transistor of FIG. 2 forms the silicide film 4 directly on the epitaxially grown SiGe mixed crystal regions 1A and 1B, while a nickel silicide film, which is thought as being an outstanding candidate silicide for the generation of 90 nm node or later, accumulates therein a tensile stress. Thus, with such direct formation of silicide layer on the SiGe mixed crystal regions 1A and 1B as in the construction of FIG. 2, the stress applied to the channel region of the p-channel MOS transistor for enhancing the hole mobility is inevitably cancelled out at least partially.

Further, such formation of silicide layer on the SiGe mixed crystal layer causes various problems such as degradation of heat resistance or morphology of the silicide with increasing Ge concentration in the SiGe mixed crystal layer, and it becomes difficult to form such a silicide layer on the SiGe mixed crystal layers with ordinary salicide process in the case the SiGe mixed crystal contains high concentration Ge for increasing the stress as in the case of the p-channel MOS transistor of FIG. 2.

In a first aspect, the present invention provides a semiconductor device, comprising:

a silicon substrate including a channel region;

a gate electrode formed on said silicon substrate in correspondence to said channel region via a gate insulation film, said gate electrode carrying respective sidewall insulation films on a pair of mutually opposing sidewall surfaces thereof;

source and drain extension regions formed in said silicon substrate at respective lateral sides of said gate electrode across said channel region in the form of a p-type diffusion region;

source and drain regions formed in said silicon substrate at respective outer sides of said sidewall insulation films in the form of a p-type diffusion region respectively as a continuation of said source extension region and a continuation of said drain extension region; and a pair of SiGe mixed crystal regions formed in said silicon substrate at respective outer sides of said sidewall insulation films so as to be included in said source region and said drain region, respectively, said pair of SiGe mixed crystal regions having an epitaxial relationship with said silicon substrate, each of said SiGe mixed crystal regions being grown to a level higher than an interface between said gate insulation film and said silicon substrate, each of said SiGe mixed crystal regions having a sidewall surface facing to another SiGe mixed crystal region such that said sidewall surface is defined by a plurality of facets forming respective, different angles with respect to a principal surface of said silicon substrate.

In another aspect, the present invention provides a method of fabricating a semiconductor device having a pair of SiGe compressive stressors at respective lateral sides of a channel region, comprising the steps of:

forming a gate electrode on said silicon substrate in correspondence to said channel region via a gate insulation film;

forming a pair of p-type diffusion regions in said silicon substrate in correspondence to respective lateral sides of said gate electrodes;

forming a pair of p-type diffusion regions in said silicon substrate in correspondence to respective lateral sides of said gate electrode with a separation from said channel region by a distance corresponding to a thickness of respective gate sidewall insulation films on said gate electrode as source and drain regions;

forming a pair of trenches in said silicon substrate respectively in correspondence to source and drain regions by conducting an etching process, such that each of said trenches has a sidewall surface defined by a plurality of facets and such that, in each of said trenches, said sidewall surface and a bottom surface are covered continuously by said p-type diffusion region constituting said source or said drain region; and filling said trenches by an epitaxial growth of a p-type SiGe layer, said epitaxial growth of said p-type SiGe layer is conducted at a temperature of 400-550° C.

In another aspect, the present invention provides a method of fabricating a semiconductor device having a pair of SiGe compressive stressors at both lateral ends of a channel region, comprising the steps of:

forming a gate electrode on a silicon substrate in correspondence to said channel region via a gate insulation film;

forming a pair of p-type diffusion regions in said silicon substrate in correspondence to both lateral sides of said gate electrode;

forming a pair of trenches in said silicon substrate respectively in correspondence to lateral sides of said gate electrode with a separation from said channel region corresponding to a gate sidewall insulation film formed on said gate electrode, such that each of said trenches has a sidewall surface defined by a plurality to f facets;

covering, in each of said pair of trenches, said sidewall surface and a bottom surface of said trench by a Si epitaxial layer doped to p-type; and filling, in each of said trenches, said trench by growing a p-type SiGe mixed crystal layer epitaxially on said Si epitaxial layer, said step of growing said p-type SiGe layer epitaxially being conducted at a temperature of 400-550° C.

According to the present invention, a uniaxial compressive stress is applied to the channel region by growing a p-type SiGe mixed crystal layer at both lateral sides of said channel region epitaxially, and the mobility of holes transported through the channel region is improved significantly.

Thereby, the present invention achieves optimization of the uniaxial stress applied to the channel region by forming the foregoing pair of p-type SiGe mixed crystal regions such that respective, mutually facing sidewall surfaces are formed of plurality of facets forming respective, different angles with respect to a principal surface of said silicon substrate, and the operational speed of the semiconductor device is improved further as compared with the conventional construction in which the foregoing sidewall surfaces of the SiGe mixed crystal regions are defined by a continuous, curved surface and thus the distance between the SiGe mixed crystal regions across the channel region increases rapidly with increasing distance in the downward direction of the silicon substrate from the interface between the gate insulation film and the silicon substrate.

Particularly, by forming the sidewall surfaces of the SiGe mixed crystal regions to have a wedge shape such that the respective SiGe mixed crystal regions invade to the region right underneath the gate sidewall insulation films from both lateral sides of the channel region, it becomes possible with the present invention to maximize the uniaxial compressive stress applied to the silicon substrate in such a channel region, including the effect of stress concentration at the wedge tip end part.

Further, because each of the p-type SiGe mixed crystal regions are formed on a limited area of the silicon substrate, it has been discovered that it is possible to increase the Ge concentration in the p-type SiGe mixed crystal regions beyond the limiting concentration corresponding to the critical thickness up to the concentration of 40% in terms of atomic percent, contrary to the case of forming a continuous, two-dimensional film. Thereby, the effect of improvement of the semiconductor device caused by the compressive stress can be maximized.

In the present invention, on the other hand, it is preferable to suppress the Ge atomic concentration such that the Ge atomic concentration does not exceed 28% in view of avoiding the problem of degradation of crystal quality of the foregoing p-type SiGe mixed crystal regions, which starts, according to the discovery of the inventor of the present invention, when the Ge atomic concentration has exceeded the value of 28%.

Further, according to the present invention, it becomes possible to reduce the adversary effect of the tensile stress caused by the silicide layers formed on the source/drain regions of the semiconductor device, by growing the p-type SiGe mixed crystal regions beyond the level of the interface between the gate insulation film of the semiconductor device and the silicon substrate. It should be noted that such a tensile stress cancels out the effect of the uniaxial compressive stress induced in the channel region.

Particularly, by growing a p-type Si layer or a p-type SiGe layer of small Ge concentration on the foregoing p-type SiGe mixed crystal regions epitaxially, it becomes possible to avoid the problems associated with the difficulty of forming a silicide layer on a SiGe mixed crystal layer of high Ge concentration.

It should be noted that the increase of hole mobility caused by application of compressive stress to the channel region of the p-channel MOS transistor appears most conspicuously when the silicon substrate is a so-called (001) substrate and the gate electrode is formed on the silicon substrate in the <110> direction.

Further, according to the present invention, in which the trench is formed at both lateral sides of the gate electrode after forming the p-type diffusion regions and such trenches are filled with the p-type SiGe mixed crystal layer by a low temperature process that uses the deposition temperature of 400-550° C., the impurity distribution profile of the diffusion regions formed already is not modified, and it becomes possible to construct the semiconductor device with the desired characteristics. Further, as a result of such a low temperature growth, it becomes possible to introduce Ge into the p-type SiGe mixed crystal layer with the concentration reaching 40% in terms of atomic percent.

Further, according to the present invention, it becomes possible to form a silicide layer in electrical connection with the source/drain regions of the semiconductor device by forming a Si epitaxial cap layer substantially free from Ge or having a Ge concentration of 20% or less, on the SiGe mixed crystal layer grown by the low temperature epitaxial process. Further, with such a construction in which the silicide layer is formed on the cap layer at the level far above the interface between the gate insulation film and the silicon substrate, the problem of cancellation of the uniaxial compressive stress caused in the channel region by the tensile stress caused by the silicide layer is reduced.

Further, with the formation of such a cap layer of relatively low Ge concentration, it becomes possible to suppress the degradation of heat resistance of the silicide layer or degradation of surface morphology of the silicide layer, which occur when the Ge concentration is increased, and stable and reliable formation of silicide becomes possible.

With the present invention, it is also possible to form the trenches in the silicon substrate at first. In this case, the SiGe mixed crystal layer is grown after growing the p-type Si epitaxial layer on the surface of the trenches. According to such a process, too, the problem of modification of the impurity distribution profile in the source extension region and drain extension region formed by injecting the impurity elements while using the gate electrode is effectively avoided.

Meanwhile, in such ultrafine and ultra fast semiconductor devices that apply the compressive stress to the channel region by the SiGe mixed crystal stressors, it is generally practiced to conduct a native oxide removal process in the channel region after formation of the device isolation regions but before formation of the gate insulation film. Thereby, it is known that, as a result of thermal annealing process conducted in high-temperature hydrogen ambient for removal of such a native oxide film, the Si atoms migrate freely over the exposed silicon substrate surface, and as a result, there appears a curved, convex surface on the silicon substrate forming the device region. Thus, when an etching process is applied to such a convex silicon surface for forming the foregoing trenches, there appears a corresponding convex surface morphology at the bottom to the trenches. Thereby, because the SiGe mixed crystal regions grown epitaxially on such trenches form a flat facet as a result of a self-limiting process occurring in such a crystal growth process, the volume of the SiGe mixed crystal regions constituting the compressive stressors is reduced by the volume of the foregoing convex surface. With this, the compressive stress caused by the SiGe mixed crystal layer is reduced unwantedly.

Contrary to the foregoing, the present invention successfully avoids such decrease of the compressive stress, by limiting the temperature of the thermal annealing process conducted before formation of the gate insulation film for removal of the gate insulation film to be 900° C. or less and further by conducting the foregoing thermal annealing process in an inert ambient free from hydrogen.

Other objects and further features of the present invention will become apparent from the following detailed description when read in conjunction with the attached drawings.

DETAILED DESCRIPTION OF THE INVENTION

First Embodiment

Figure 3:
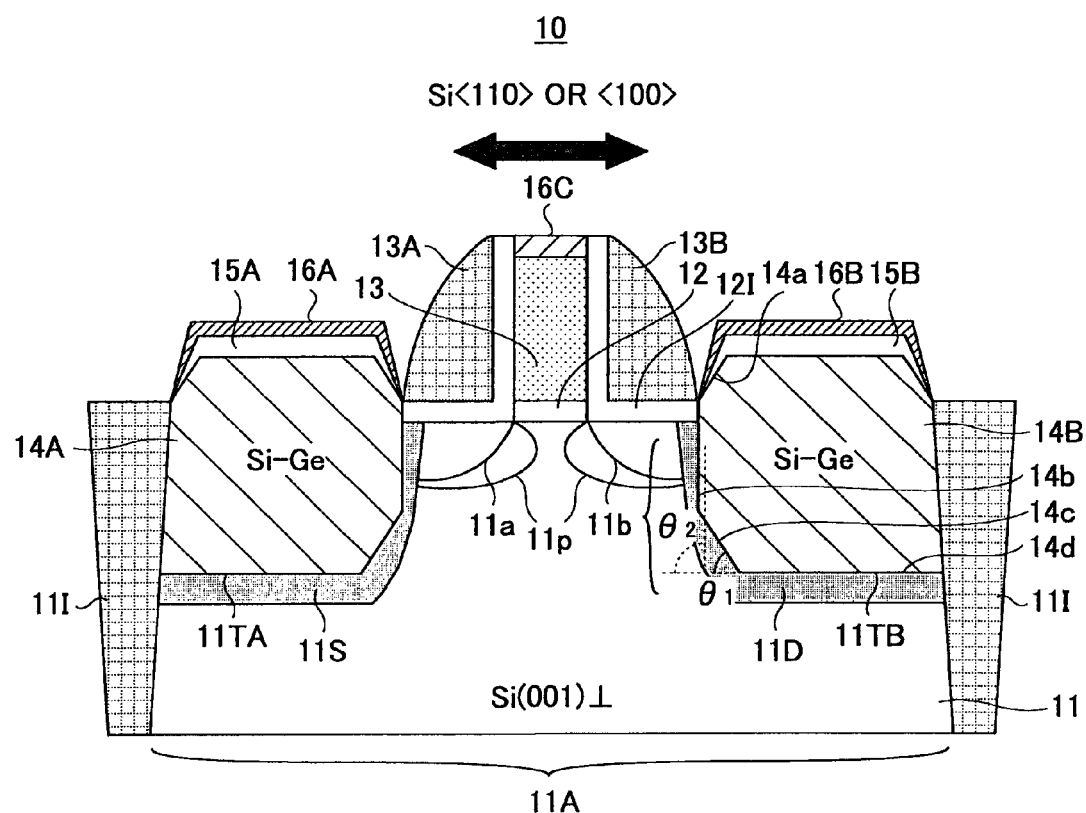
FIG. 3 is a diagram showing the construction of a semiconductor device according to a first embodiment of the present invention.

FIG. 3 shows the construction of a p-channel MOS transistor 10 according to a first embodiment of the present invention.

Referring to FIG. 3, the p-channel MOS transistor 10 is formed on an n-type device region 11A defined on a silicon substrates of a (001) surface orientation by a STI device isolation region 11I, wherein a high quality gate insulation film 12 of a thermal oxide film or an SiON film is formed on the silicon substrate 11 in correspondence to a channel region in the device region 11A with a thickness of about 1.2 nm.

On the gate insulation film 11, there is formed a polysilicon gate electrode 12 doped to a p-type, wherein the silicon substrate surface exposed at both lateral sides of the gate electrode 13 is covered with CVD oxide films 12I in the aforementioned device region 11A. Thereby, it should be noted that each CVD oxide film 12I extends continuously and covers the sidewall surface of the gate electrode 13. Further, sidewall insulation films 13A and 13B are formed on the respective sidewall surfaces of the gate electrode 13 via the respective thermal oxide films 12I.

Further, trenches 11TA and 11TB are formed in the silicon substrate 11 at respective outer sides of the sidewall insulation films 13A and 13B, wherein the foregoing trenches 11TA and 11TB are filled with respective p-type SiGe mixed crystal regions 14A and 14B, which are grown epitaxially on the silicon substrate 11 at the foregoing trenches 11TA and 11TB.

Figure 1:
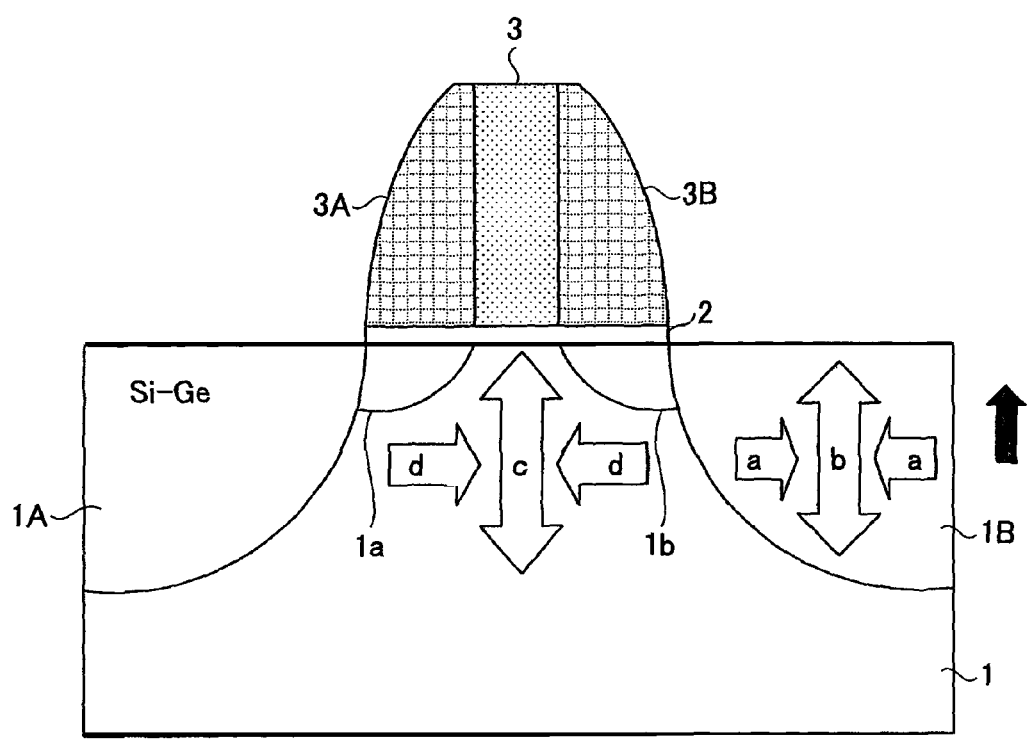
FIG. 1 is a diagram showing the principle of the semiconductor device that uses the SiGe mixed crystal layer as a compressive stressor.

Because the SiGe regions 14A and 14B thus grown epitaxially to the silicon substrate 11 have a larger lattice constant as compared with the Si crystal that constitutes the silicon substrate 11, the SiGe regions 14A and 14B induces a uniaxial compressive stress in the channel region formed in the silicon substrate 11 right underneath the gate electrode 13 by the mechanism explained previously with reference to FIG. 1.

Furthermore, with the p-channel MOS transistor 10 of FIG. 3, there are formed n-type pocket injection regions 11p in the silicon substrate 11 in correspondence to the device region 11A by injecting an n-type impurity element such as Sb obliquely to the regions of the silicon substrate 11 at both lateral sides of the gate electrode 13. Further, a source extension region 11a and a drain extension region 11b of p-type are formed so as to partially overlap with the foregoing pocket injection regions 11p.

The foregoing p-type source and drain extension regions 11a and 11b extend up to the p-type SiGe mixed crystal regions 14A and 14B respectively, wherein it should be noted that the p-type SiGe mixed crystal regions 14A and 14B are formed in continuation with the p-type diffusion regions 11S and 11D respectively. It should be noted that the p-type diffusion regions 11S and 11D constitute respectively the source region and the drain regions of the p-channel MOS transistor 10.

It should be noted that the p-type diffusion regions 11S and 11D are formed so as to include the SiGe mixed crystal regions 14A and 14B respectively. As a result of such a construction, direct contact between the p-type SiGe mixed crystal region 14A or 14B having a small bandgap and the n-type Si well that constitutes the device region 11A is eliminated, and occurrence of leakage current at the pn junction of Si/SiGe interface is suppressed.

Further, with the construction of FIG. 3, Si epitaxial layers 15A and 15B are formed on the SiGe mixed crystal regions 14A and 14B respectively, and silicide layers 16A and 16B are formed on the surface of the Si epitaxial layers 15A and 15B. Further, a similar silicide layer 16C is formed on the gate electrode 13.

With the p-channel MOS transistor 10 of the present embodiment, each of the SiGe mixed crystal regions 14A and 14B is defined by sidewall surfaces 14a, 14b, 14c and also a bottom surface 14d as shown in FIG. 3, wherein it should be noted that each of the sidewall surfaces 14a, 14b, 14c and the bottom surface 14d is formed of a flat facet.

In the illustrated example, the bottom surface 14d is formed of a (001) surface parallel to the principal surface of the silicon substrate 11 while the facet 14b forms an angle θ2 generally perpendicular to the bottom surface 14d. Further, the facet 14c forms a smaller angle θ1 than the foregoing angle θ2 with respect to the bottom surface 14d.

Thus, it is the object of the present invention to provide a p-channel transistor capable of providing a performance superior to that of the conventional p-channel MOS transistor that uses the SiGe mixed crystal regions as the compressive stressor, by optimizing the uniaxial compressive stress field induced in the device region 11A in correspondence to the channel region right underneath the gate electrode 13 by constructing the bottom surface and the sidewall surface of the SiGe mixed crystal regions 14A and 14B by plural flat facets 14a-14d.

Figure 2:
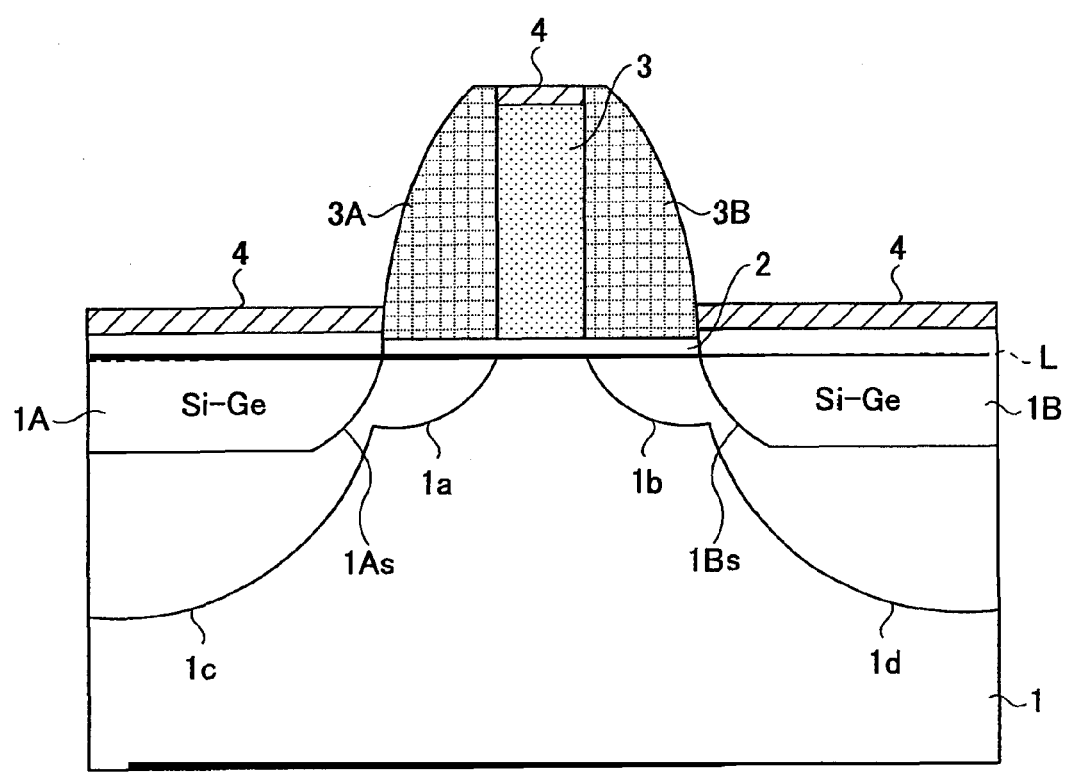
FIG. 2 is a diagram showing the construction of a conventional semiconductor device that uses a SiGe mixed crystal layer as the compressive stressor.

In the construction of FIG. 3, it should be noted that the mutually opposing sidewall surfaces of the SiGe mixed crystal regions 14A and 14B that define the channel region right underneath the gate insulation film 12 are formed of the facet 14b that extends perpendicularly to the principal surface of the silicon substrate 11. Thus, the distance between the mutually opposing SiGe mixed crystal regions 14A and 14B does not increase in the downward direction of the silicon substrate 11 from the interface between gate insulation film 12 and the silicon substrate 11, contrary to the conventional construction of FIG. 1 or FIG. 2, and it becomes possible to confine the uniaxial compressive stress to the channel region effectively.

Here, it should be noted that the facet 14c is formed such that the SiGe mixed crystal regions 14A and 14B do not protrude to the n-type well constituting the device region in the silicon substrate 11 from the p-type diffusion region that constitutes the source region 14S or the drain region 14D.

On the other hand, in each of the SiGe mixed crystal regions 14A and 14B, it should be noted that the sidewall surface defining the SiGe mixed crystal region 14A or 14B changes the angle thereof to the principal surface of the silicon substrate 11 discontinuously from the angle θ2 to the angle θ1 at the part where the facet 14b meets the facet 14c, while such a discontinuous change of the facet angle enables concentration of the compressive stress to the part of the device region 11A located between the SiGe mixed crystal regions 14A and 14B.

FIGS. 4A-4F show various modifications of the p-channel semiconductor device according to the first embodiment of the present invention. In the drawings, those parts corresponding to the parts explained previously are designated by the same reference numerals and description thereof will be omitted. It should be noted that FIGS. 4A-4F show the state before formation of the silicide regions 16A-16C. In the drawings, and also in the drawings to be explained hereinafter, illustration of the pocket injection regions 11p will be omitted.

Figure 4A:
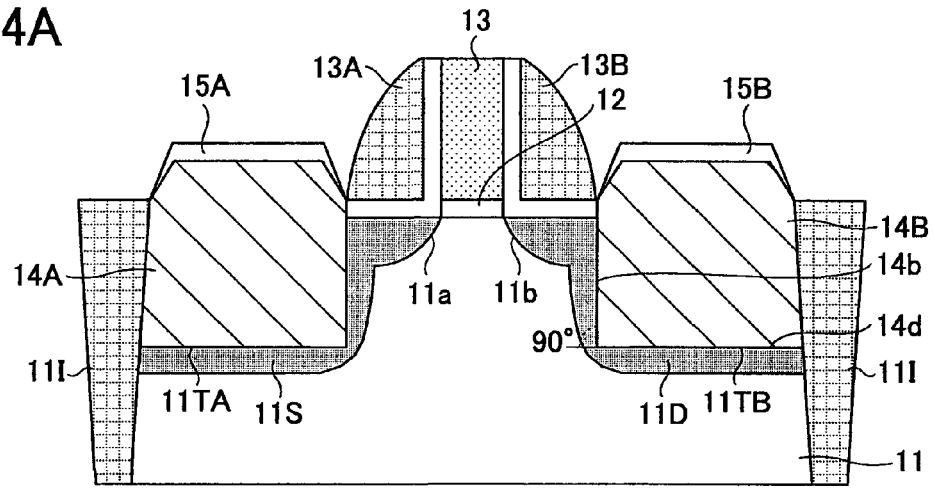
FIGS. 4A-4F are diagrams showing various modifications of the semiconductor device of FIG. 3.

Referring to FIG. 4A, the sidewall surfaces of the SiGe mixed crystal regions 14A and 14B are formed by the facet 14b generally perpendicular to the principal surface of silicon substrate 11 and also by the bottom surface 14d parallel to the principal surface of the silicon substrate 11, wherein the facet 14b and the bottom surface 14d form an angles of substantially 90 degrees.

Figure 5A:
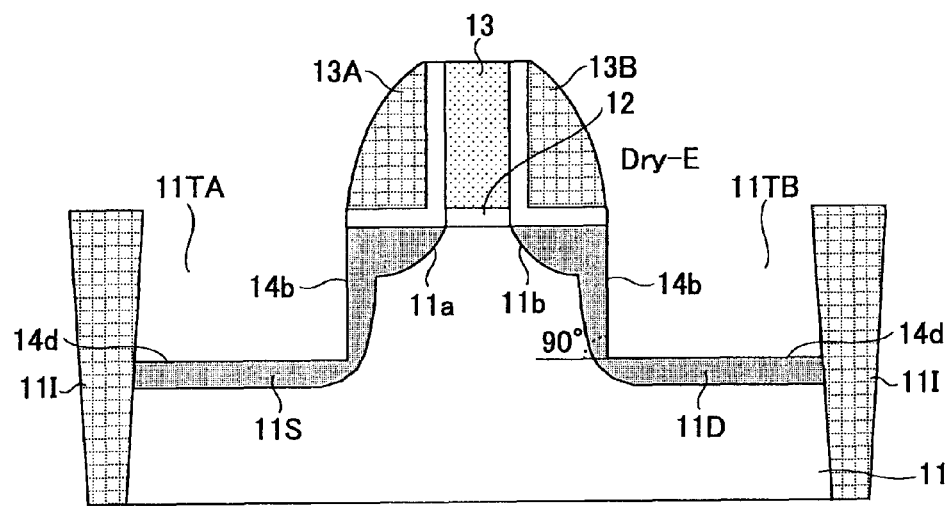
FIGS. 5A-5D are diagrams showing a trench formation process of various semiconductor devices according to the first embodiment of the present invention.

In the construction of FIG. 4A, the trenches 11TA and 11TB, in which formation of the SiGe mixed crystal regions 14A and 14B is made, are formed by a dry etching process as shown in FIG. 5A, wherein the location of the bottom surface 14d of the SiGe mixed crystal regions 14A and 14B are set such that the corner part of the SiGe mixed crystal regions 14A and 14B, where the facet 14b and the bottom surface 14d intersect with each other, does not protrude into the region of the n-type well from the foregoing source/drain regions 11S and 11D. Filling of the trenches 11TA and 11TB with the SiGe mixed crystal regions 14A and 14B will be described in detail later.

Figure 4B:
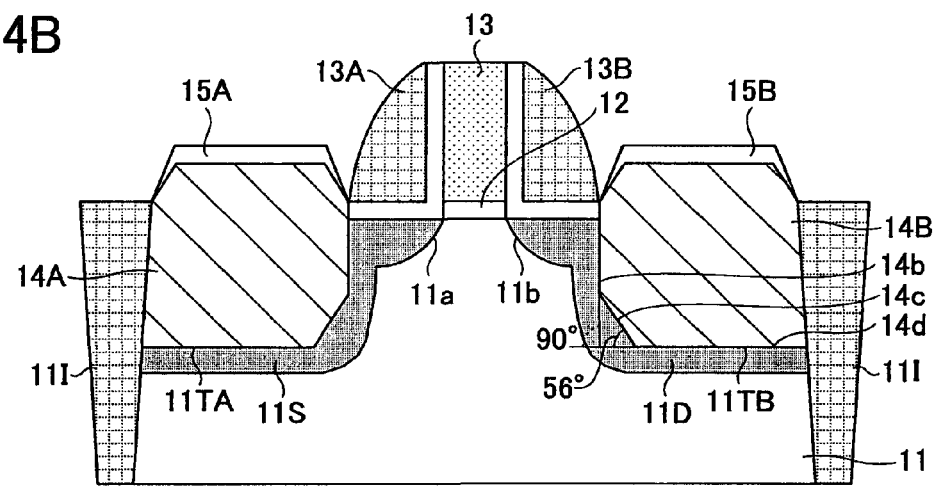
Figure 5B:
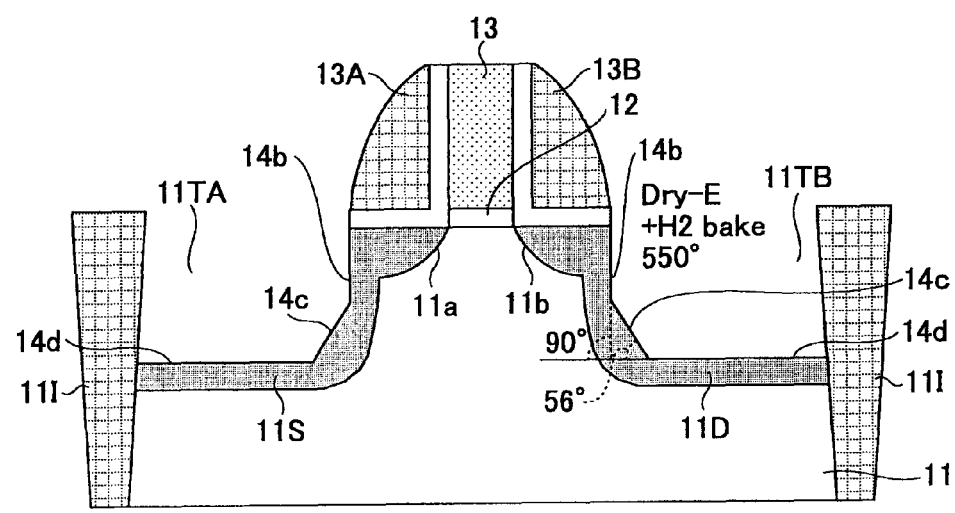

Contrary to this, the construction of FIG. 4B corresponds to the construction of FIG. 3 explained previously, in which the facet 14b is formed perpendicularly to the silicon substrate 11 at first by forming the trenches 11TA and 11TB by a dry etching process, as shown in FIG. 5B, wherein the facet 14c under the facet 14b is formed subsequently by applying a thermal processing to the silicon substrate 11 at 550° C. in a hydrogen ambient after the foregoing dry etching process. Thereby, the facet 14c is formed by the Si (111) surface that forms an angle of 56 degrees with respect to the principal surface of the silicon substrate 11.

Because the corner where the facet 14b and the bottom surface 14d meet with each other is truncated by the facet 14c in the construction of FIG. 4B, the risk that the corner part protrudes into the n-type well beyond the source region 11S or 11D is reduced even if the bottom surfaces 14d of the SiGe mixed crystal regions 14A and 14B are formed at a relatively deep level in the silicon substrate 11. Filling of the trenches 11TA and 11TB with the SiGe mixed crystal regions 14A and 14B will be described in detail later.

Figure 4C:
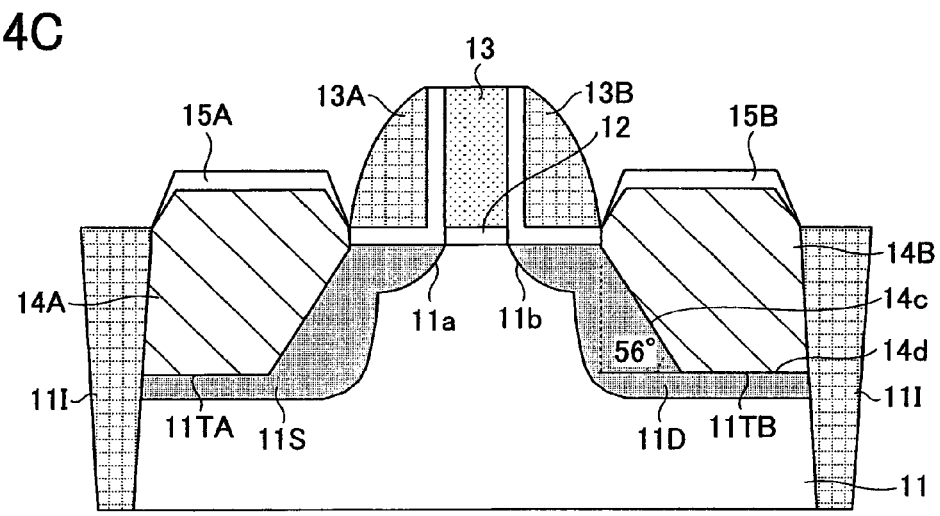
Figure 5C:
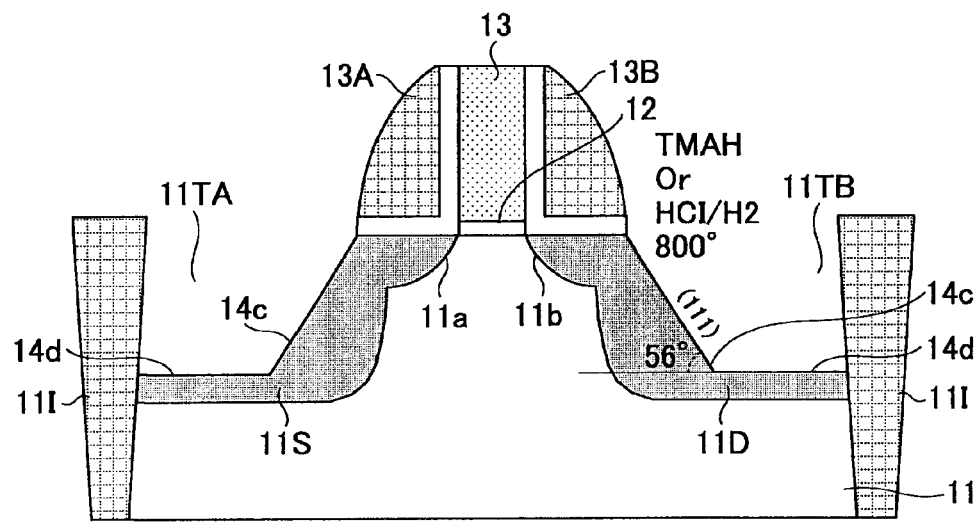

The construction of FIG. 4C is formed by forming the trenches 11TA and 11TB by applying a wet etching process to the silicon substrate 11 by using an organic alkaline etchant (hydration tetramethyl ammonium: TMAH, choline, or the like) or hydration ammonium, or alternatively, by applying a heat treatment of 800° C. in an ambient of hydrogen gas and HCl as shown in FIG. 5C. In this case, the facet 14b perpendicular to the silicon substrate 11 is not formed in the SiGe mixed crystal layer regions 14A and 14B, and instead, a facet 14c of a Si (111) surface starts right away from the interface between the gate insulation film 12 and the silicon substrate 11 with the angles of 56 degrees to the principal surface of the silicon substrate 11.

Figure 4D:
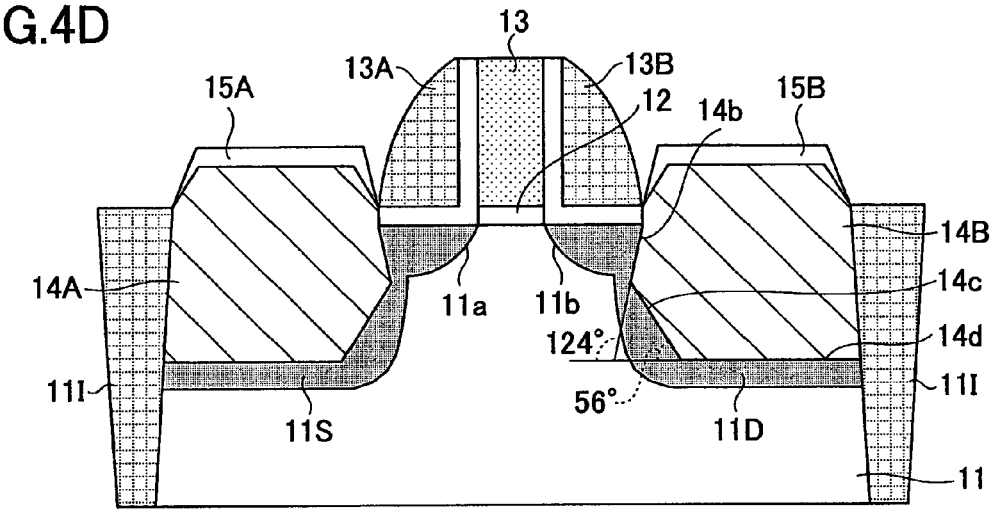
Figure 5D:
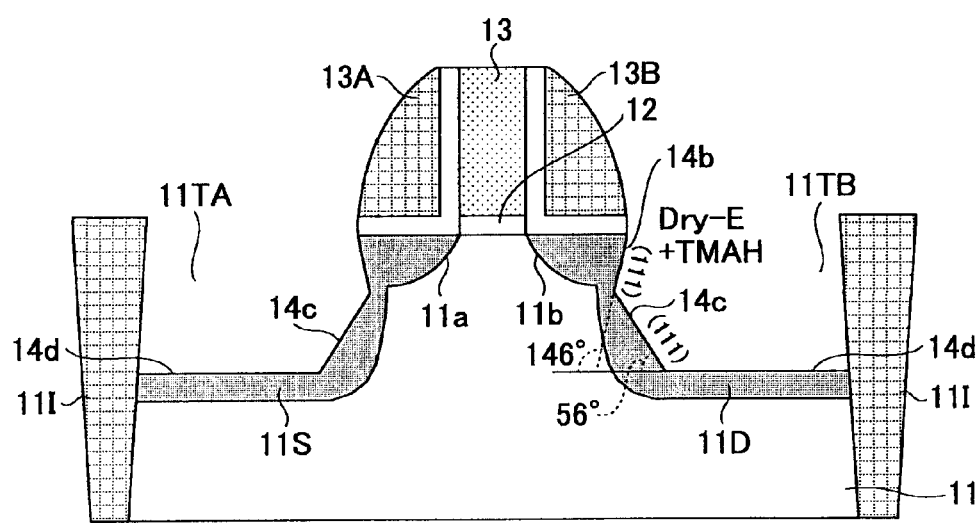

In the construction of FIG. 4D, formation of the trenches 11TA and 11TB in the silicon substrate 11 is started by a dry etching as shown in FIG. 5D, followed by a wet etching process that uses TMAH or choline, hydration ammonium, or the like, as the etchant.

As a result of such a dry etching process, the facet 14b is formed at first in the silicon substrate 11 perpendicularly to the principal surface of the silicon substrate 11, while the facet 14b is changed to a slope formed of the (111) surface by applying a wet etching process to the facet 14b by using TMAH. Further, there is formed another facet 14c formed of the (111) surface.

Thereby, it should be noted that the facet 14b and the facet 14c thus formed define together a space of wedge form as the foregoing trenches 11TA and 11TB, such that the wedge formed trenches 11TA and 11TB invade in the silicon substrate 11 into the region right underneath the sidewall insulation films 13A and 13B toward the channel region. Here, it should be noted that the facet 14c forms the angle of about 56 degrees to the principal surface of the silicon substrate 11 in correspondence to the Si (111) surface, while the facet 14b forms the angle of about 146 degrees also in correspondence to the Si (111) surface.

According to the construction of FIG. 4D, the SiGe mixed crystal regions 14A and 14B grown so as to fill the wedge-shaped trenches 11TA and 11TB have respective tip ends invading to the region right underneath the sidewall insulation films 13A and 13B and coming close to the channel region formed right underneath the gate insulation film 12. Thereby, a strong uniaxial compressive stress is applied to the channel region and mobility of the holes is improved significantly in the channel region. Thereby, because of the sharply pointed tip end part of the SiGe mixed crystal regions 14A and 14B defined by intersection of two crystal surfaces, there occurs concentration of stress at such a tip end part, and the effect of increasing the stress in the channel region is enhanced further.

Figure 4E:
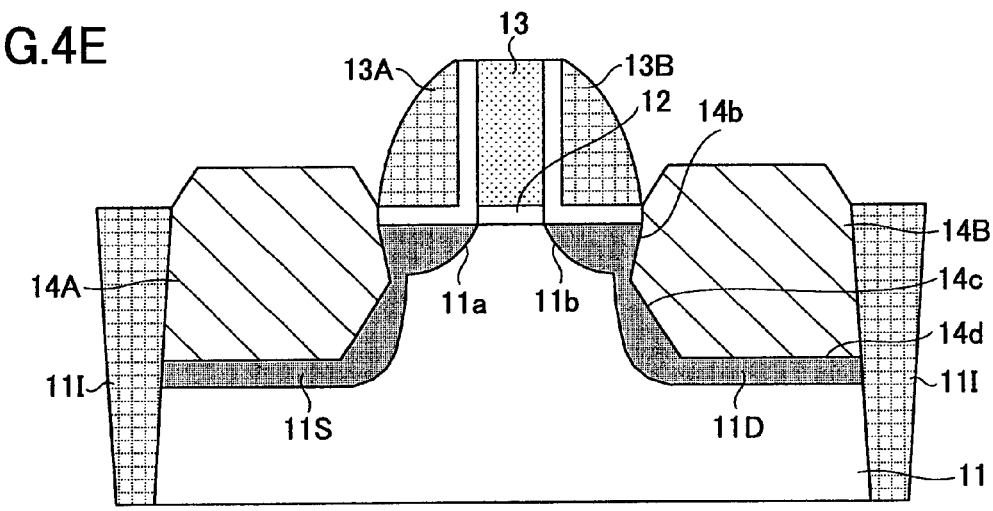

The construction of FIG. 4E is the one based on the construction of FIG. 4D and represents the case in which formation of the Si epitaxial layers 15A and 15B on the SiGe mixed crystal regions 14A and 14B is omitted.

Figure 4F:
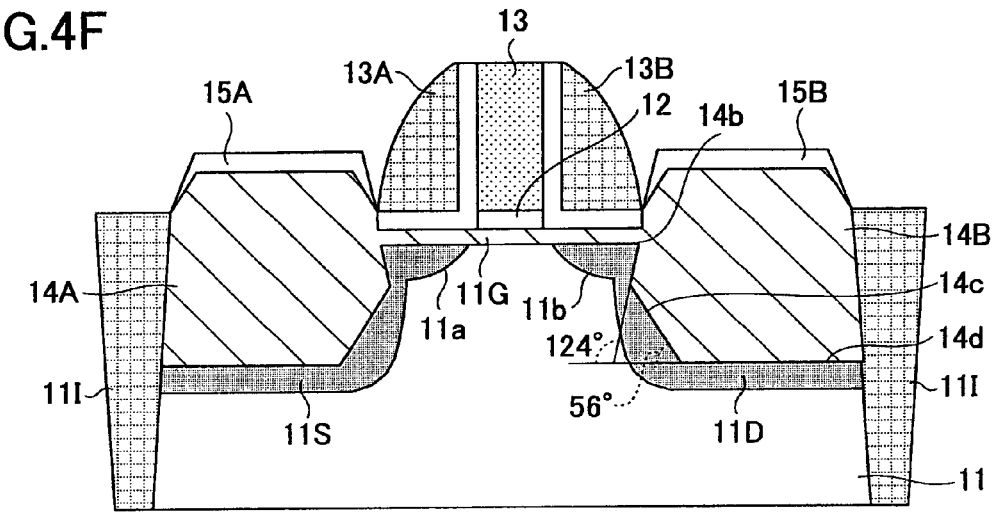

Further, the construction of FIG. 4F is also based on the construction of FIG. 4D and represents the case in which a channel layer 11G of a SiGe mixed crystal is formed epitaxially on the silicon substrate 11 in correspondence to the region right underneath the gate insulation film 12. According to such a construction, the channel layer 11G itself induces the uniaxial compressive stress, and it becomes possible to improve the mobility of the holes further in the channel layer 11G.

Figure 6:
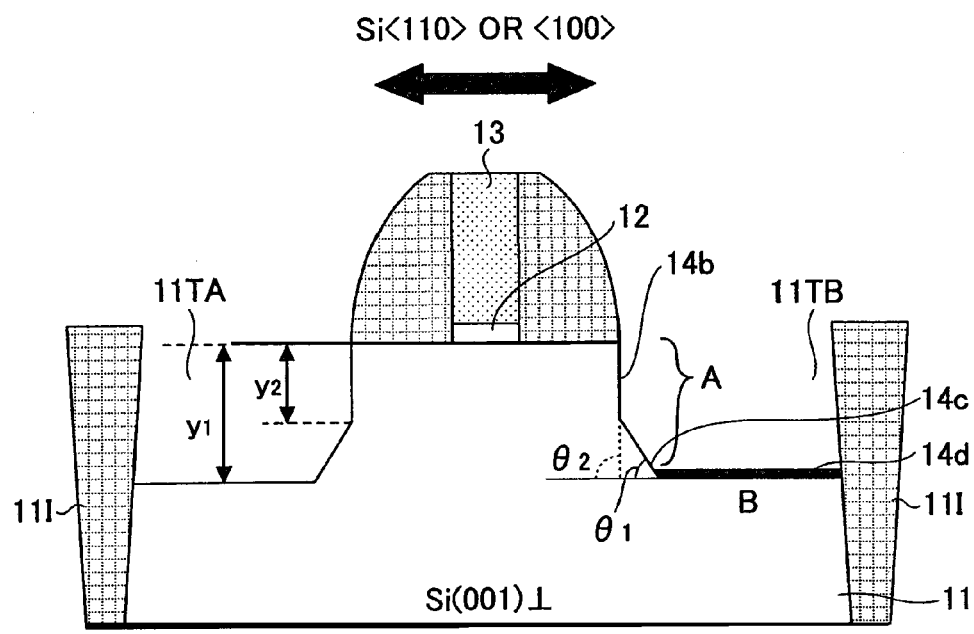
FIG. 6 is a diagram defining various parameters of the semiconductor device according to the first embodiment of the present invention.

FIG. 6 is a diagram summarizing the formation process of trenches 11TA and 11TB shown in FIGS. 5A-5D in which the epitaxial growth of the SiGe mixed crystal regions 14A and 14B is made.

Referring to FIG. 6, the silicon substrate 11 is a so-called (001) substrate having a (001) surface, and the trenches 11TA and 11TB have respective sidewall surfaces each defined by a bottom surface 14d and facets 14b and 14c. Thereby, the facet 14b forms the angle θ2 to the principal surface of silicon substrate 11, while the facet 14c forms the angle θ1 with respect to the principal surface of the silicon substrate 11. Thereby, the bottom surface 14d is formed at the depth y1 as measured from the interface between the gate insulation film 12 and the silicon substrate 11, while the facet 14b is formed down to the depth y2. While it is preferable that the gate electrode 13 extends on the surface of the silicon substrate 11 generally in the <110> direction, the gate electrode 13 may extend also generally in the <100> direction.

Especially, in the construction of FIG. 4A, it is preferable to set any of the foregoing angles θ1 and θ2 to about 90 degree and the depth y1 to 20-70 nm. It should be noted that such a depth y1 can be controlled with high precision by using a dry etching process.

In the construction of FIG. 4B, it is preferable to set the angle θ1 to the range of 40-60 degrees and the angle θ2 up to about 90 degrees. Thereby, it is preferable to set the depth y1 to the range of 20-70 nm and the depth y2 to the range of 10-60 nm. These depths y1 and y2 can be controlled with high precision by applying a dry etching process to the silicon substrate 11.

Particularly, the angle θ1 takes the value of 56 degrees in the case the facet 14c is formed of the Si (111) surface as explained before with reference to FIG. 4B. However, it should be noted that the foregoing angle θ1 is by no means limited to the angles of 56 degrees. Thereby, it should be noted that the angle θ2 can be controlled with high precision by the heat treatment process conducted subsequently to the foregoing dry etching process at about 550° C. in the hydrogen ambient.

Furthermore, in the construction of FIG. 4C, the angles θ1 and θ2 take the range of 50-60 degrees, and in the special case in which the facet 14c is formed of the Si (111) surface, the angles θ1 and θ2 take the value of 56 degrees. However, the angles θ1 and θ2 are by no means limited to the foregoing angle of 56 degrees. Also, while the depth y2 becomes zero in the construction of FIG. 4C, it is preferable to set the depth y1 to the range of 20-70 nm. It should be noted that such angle θ1, θ2 and the depth y1 can be controlled with high precision by using a wet etching process applied to the silicon substrate 11 while using the organic alkaline etchant such as TMAH, or alternatively, by a high temperature gas phase etching process conducted in a HCl/hydrogen ambient.

Further, in the construction of FIGS. 4D-4F, it is preferable to control the depth y1 to the range of 20-70 nm, the depth y2 to the range of 10-60 nm, the angle θ1 to the range of 40-60 degrees and the angle θ2 to the range of 90-150 degrees, by consecutively applying a dry etching process and a wet etching process that uses the organic alkaline etchant such as TMAH, to the silicon substrate 11. Thereby, it should be noted that it is possible with the present invention to control the angles θ1 and θ2 and also the depths y1 and y2 precisely, by combining the dry etching process and the wet etching process at the time of formation of the trenches 11TA and 11TB. In this case, too, the angles θ1 and θ2 take the value of 56 degrees and 146 degrees respectively in the case the facets 14b and 14c are formed by the Si (111) surface. However, it should be noted that the construction of FIGS. 4D-4F is not limited in the case in which the facets 14b and 14c are formed by the Si (111) surface.

In any of the methods of FIGS. 5A-5D, it should be noted that the p-type source region 11S and the p-type drain region 11D are formed in the silicon substrate 11 at the outer sides of the sidewall insulation films 13A and 13B, prior to the formation of the trenches 11TA and 11TB. It should be noted that the trenches 11TA and 11TB are formed inside such p-type diffusion regions so as not to exceed the p/n junction interface thereof.

Figure 7:
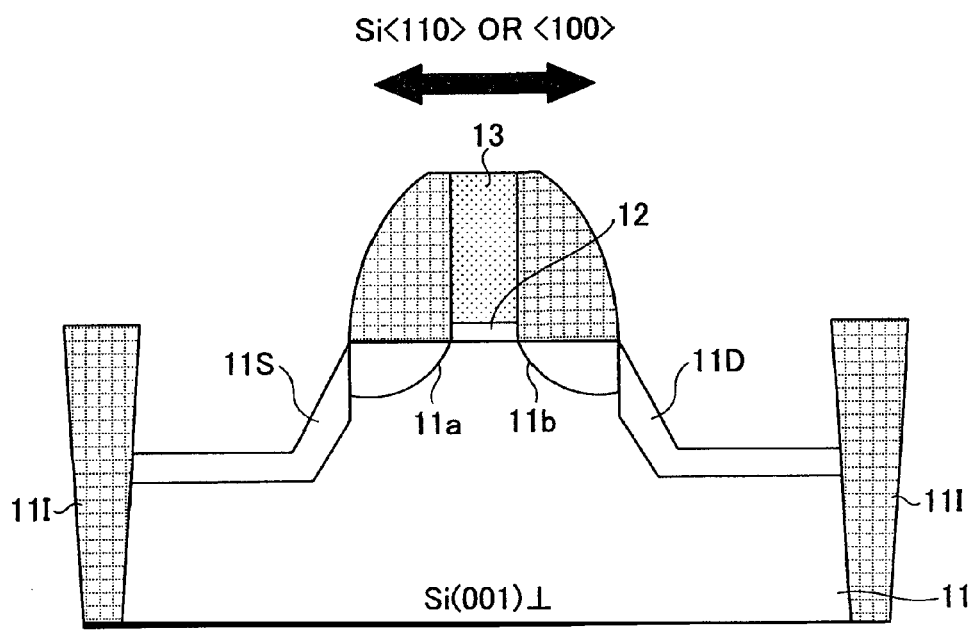
FIG. 7 is a diagram showing the fabrication process of the semiconductor device according to a modification of the present invention.

In any of the methods of FIGS. 5A-5D, it is possible to form the trenches 11TA and 11TB directly in the n-type Si well formed in the device region 11A of the silicon substrate 11 before formation of the source/drain diffusion region 11S, 11D as shown in the example of FIG. 7 and thereafter grow a p-type Si layer selectively on the surface of the trenches 11TA and 11TB while supplying the Si gaseous source together with a p-type dopant gas.

Second Embodiment

Hereinafter, the fabrication process of the p-channel MOS transistor of FIG. 4D will be explained with reference to FIGS. 8A-8E.

Figure 8A:
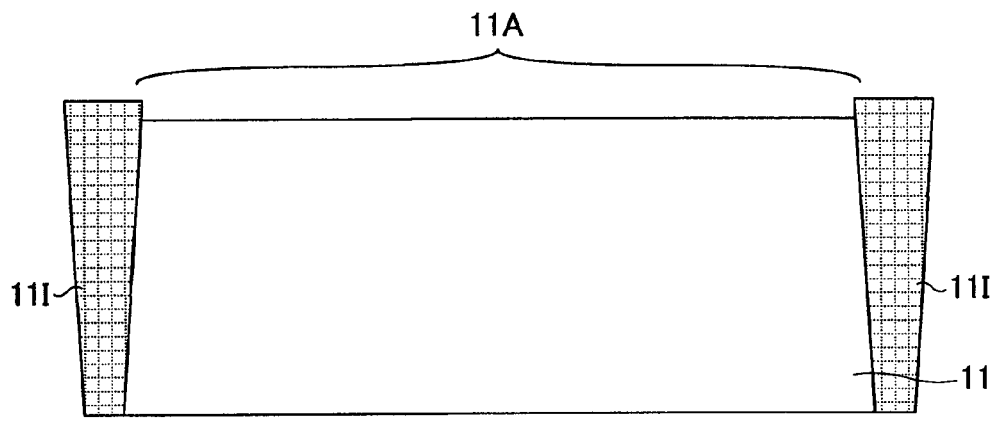
FIGS. 8A-8E are diagrams showing the fabrication process of the semiconductor device of FIG. 4D according to a second embodiment of the present invention.

Referring to FIG. 8A, the device region 11A is defined on the surface of p-type silicon substrate 11 by the STI type device isolation structure 11I, and an n-type well is formed in the device region 11A by injecting an n-type impurity element into the device region 11A.

Figure 8B:
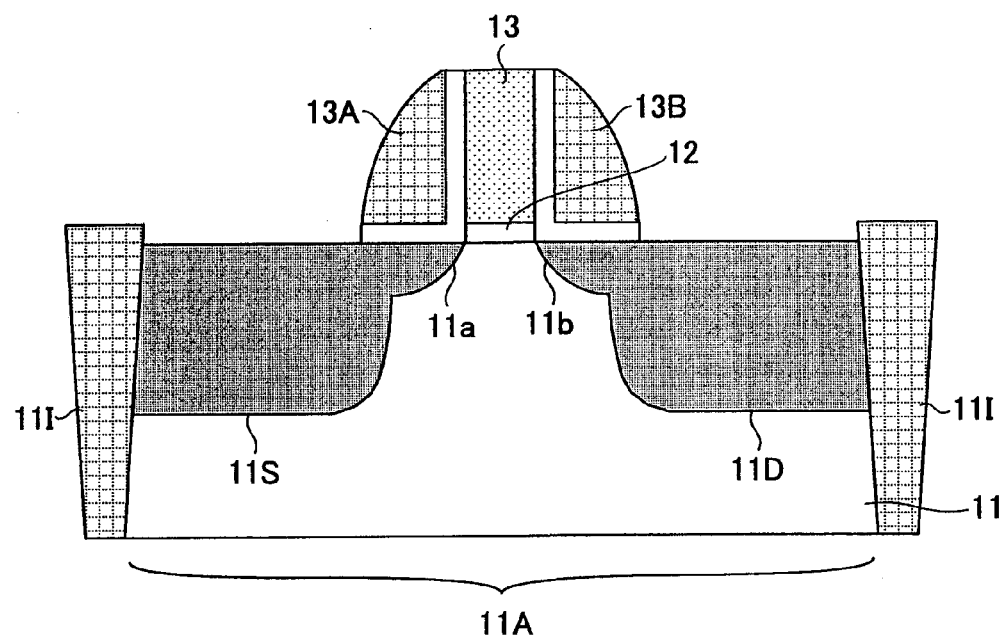

Further, in the step of FIG. 8B, the gate insulation film 12 and the polysilicon gate electrode 13 are formed on the silicon substrate 11 in correspondence to the device region 11A as a result of patterning of an SiON film and a polysilicon film formed uniformly on the silicon substrate 11, and the p-type source extension region 11a and the p-type drain extension region 11b are formed in the device region 11A by injection of a p-type impurity element such as B+ while using the polysilicon gate electrode 13 as a mask.

Further, after formation of the sidewall insulation films 13A and 13B on the polysilicon gate electrode 13, the p-type impurity element such as B+ is injected once more, and as a result, the p-type source region 11S and the p-type drain region 11D are formed in the device region 11A of the silicon substrate 11 at the outer sides of the sidewall insulation films 13A and 13B.

Figure 8C:
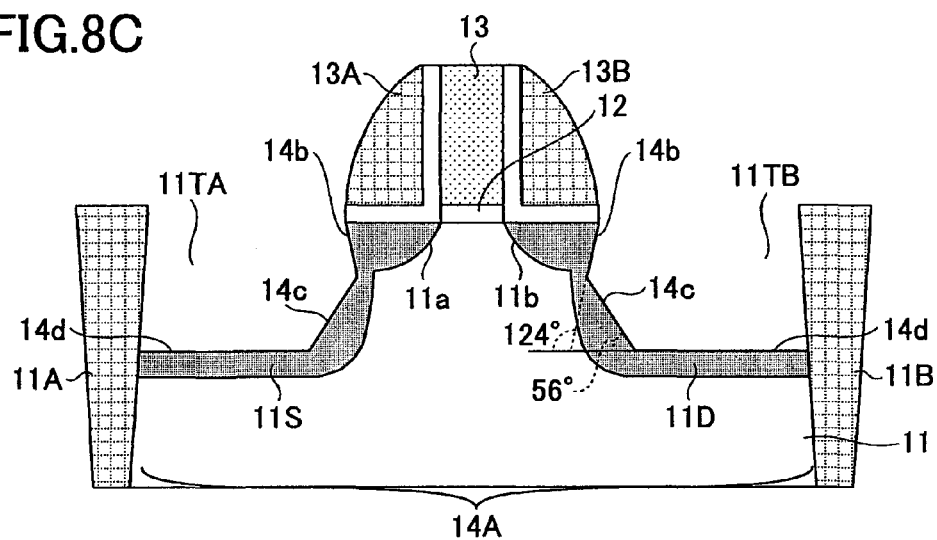

Next, in the step of FIG. 8C, a part of the device region of the silicon substrate 11 outside the sidewall insulation films 13A and 13B are etched first by a dry etching process with the depth of 10-60 nm.

As a result of such a dry etching process, there are formed trenches in the silicon substrate 11 such that each trench is defined by vertical sidewall surfaces perpendicular to the principal surface of the silicon substrate 11 and a horizontal bottom surface, similarly to the case of FIG. 5A explained previously. In the step of FIG. 8C, the vertical sidewall surface is etched further by a wet etching process that uses TMAH as the etchant, and with this, the trenches 11TA and 11TB are formed such that the facets 14b and 14c define the wedge-shaped sidewall surface of the trenches 11TA and 11TB. In the state of FIG. 8C, it should be noted that the tip end part of the foregoing wedge is formed close to the channel region located right under gate electrode 13 by invading inward of the outer edges of the sidewall insulation films 13A and 13B.

Figure 8D:
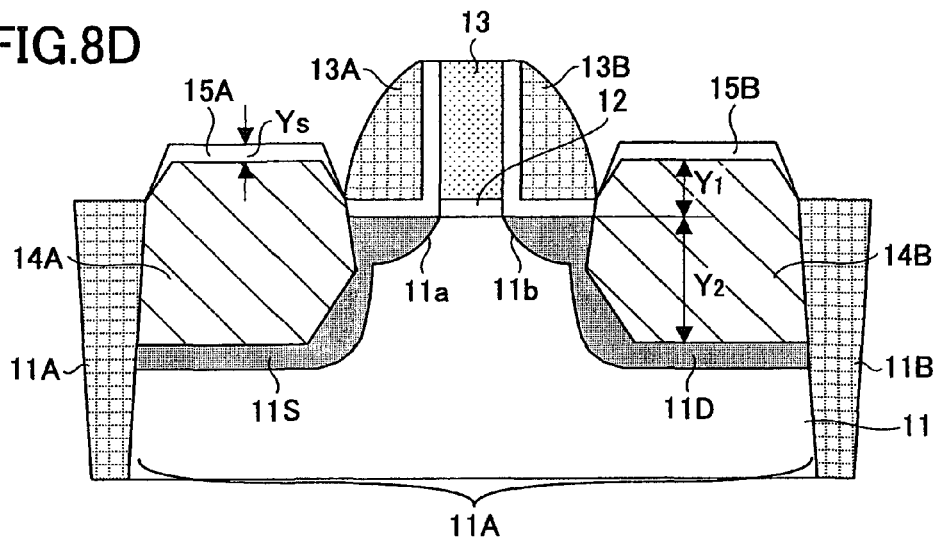

Further, in the step of FIG. 8D, the structure of FIG. 8C is introduced into a low-pressure CVD apparatus filled with an inert gas such as hydrogen gas, nitrogen gas, Ar gas, He gas, or the like, and held to the pressure of 5-1330 Pa, after a removal process of native oxide film, and held for 5 minutes in the maximum at the foregoing pressure of 5-1330 Pa ($H_2$-Bake) after heating to the temperature of 400-550° C. in a hydrogen ambient (Heat-UP).

Further, while holding the partial pressure of the inert gas ambient such as hydrogen, nitrogen, He or Ar to 5-1330 Pa at the substrate temperature of 400-550° C., a silane (SiH$_4$) gas, a germane (GeH$_4$) gas and a diborane (B$_2$H$_6$) gas are supplied over the duration of 1-40 minutes respectively as the gaseous source of Si, the gaseous source of Ge and the dopant gas, with respective partial pressures of 1-10 Pa, 0.1-10 Pa and 1×10$^{-5}$-1×10$^{-3}$ Pa, in addition to a hydrogen chloride (HCl) gas supplied as an etching gas with the partial pressure of 1-10 Pa. With this, the p-type SiGe mixed crystal regions 14A and 14B are grown epitaxially in the trenches 11TA and 11TB respectively (SiGe-Depo).

With such an epitaxial growth of the SiGe mixed crystal layers 14A and 14B, it should be noted that the crystal quality of the SiGe mixed crystal layers 14A and 14B is improved particularly when the (100) surface or (111) surface of Si is exposed at the bottom surface or sidewall surface of the trenches 11TA and 11TB. From this viewpoint, too, the construction having the sidewall surface of the wedge form defined by the facets 14b and 14c forming the Si (111) surfaces shown in FIG. 8C, is thought advantageous for the trenches 11TA and 11TB.

In the process of FIG. 8D, the SiGe mixed crystal layers 14A and 14B filling the trenches 11TA and 11TB induce the uniaxial compressive stress originating from the lattice constant difference with respect to the silicon substrate 11 in the channel region right underneath the gate insulation film 12 in the foregoing device region 11A. Because the tip end parts of the wedges invade to the regions located right underneath the sidewall insulation films 13A and 13B in the silicon substrate 11, a large compressive stress is applied to the channel region right underneath the gate insulation film 12.

Further, in the step of FIG. 8D, a p-type semiconductor layer primarily formed of Si is formed on the SiGe mixed crystal layers 14A and 14B to a thickness Ys of 0-20 nm, by supplying the silane gas and the diborane gas with respective partial pressures of 1-10 Pa and 1×10$^{-4}$-1×10$^{-2}$ Pa, together with the hydrogen chloride (HCl) gas of the partial pressure of 1-10 Pa, at the temperature equal to or lower than the temperature used for forming the SiGe mixed crystal layers 14A and 14B. With this, the cap layers 15A and 15B are respectively formed on the SiGe mixed crystal regions 14A and 14B (CapSi-Depo). Here, it should be noted that the case in which the thickness Ys is set to 0 nm means that there occurs no formation of the cap layers 15A and 15B.

Figure 8E:
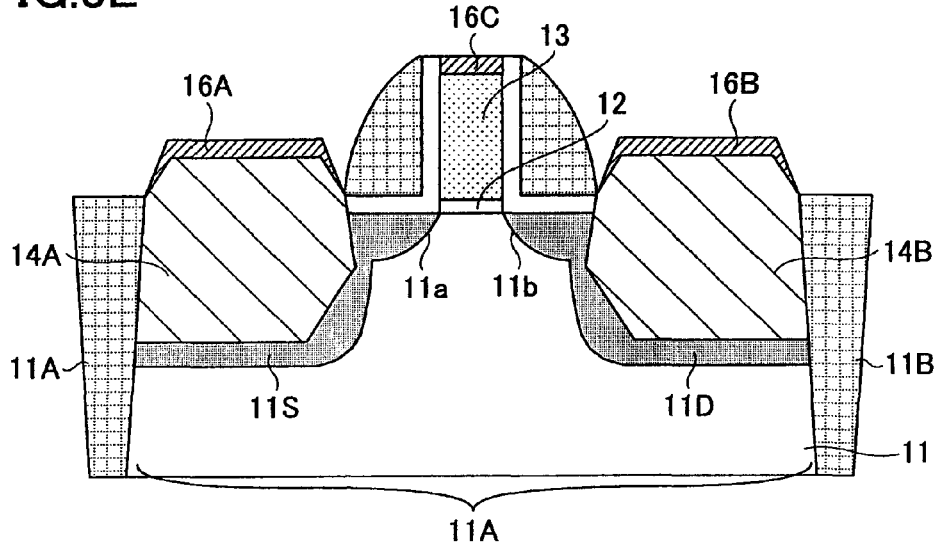

It should be noted that the foregoing cap layers 15A and 15B are provided in anticipation of the silicide formation process of FIG. 8E, and thus, it is preferable to use a p-type silicon layer, on which silicide formation is made easily, while it is possible that the cap layers 15A and 15B contain Ge with the atomic concentration if 0-20%. Further, it is possible to use a SiGeC mixed crystal layer containing about 2% of C (carbon) in terms of atomic concentration for the cap layers 15A and 15B. In the case Ge is to be incorporated into the cap layers 15A and 15B, a GeH$_4$ gas may be added to the gaseous source in the growth process of the cap layers with a partial pressure of 0-0.4 Pa.

In the case the material constituting the sidewall insulation films 13A and 13B contains Si with relatively large amount, the selectivity of growth of the SiGe mixed crystal layer tends to become deteriorated, and there may be caused a growth of SiGe nuclei on such sidewall insulation films 13A and 13B in the case the growth of SiGe mixed crystal regions have been conducted according to the foregoing process.

In such a case, the structure of FIG. 8D is exposed to a hydrogen chloride (HCl) gas for short time period at the same temperature used for growing the SiGe mixed crystal regions 14A and 14B or lower, such that the part of the sidewall insulation films 13A and 13B or the device isolation structure 11I that may become the nuclei of silicide growth is removed by etching (PostEtch).

The structure thus obtained is then cooled to the temperature below 400° C. in an inert ambient (CoolDown) and taken out from the low pressure CVD apparatus.

It should be noted that this PostEtch process can be conducted for example in an inert or reducing ambient of hydrogen, nitrogen, He, or the like, under the process pressure of 5-1000 Pa while supplying the hydrogen chloride gas with the partial pressure of 10-500 Pa over the duration of typically 0-60 minutes.

Further, the substrate of FIG. 8D thus taken out is introduced to a sputtering apparatus in the process of FIG. 8E and silicide films 16A and 16B of nickel silicide or cobalt silicide are formed on the cap layers 15A and 15B respectively, by a salicide process. In the step of FIG. 8E, a silicide film 16C is formed also on the polysilicon gate electrode 13 simultaneously.

Thus, with the process of FIG. 8D, in which the SiGe mixed crystal layer is formed by a low temperature process at the temperature of 550° C. or lower, there occurs no substantial change of distribution profile of the impurity element in any of the pocket injection regions not illustrated or the source/drain extension regions 11a and 11b, or further in the source/drain regions 11S and 11D, even when formation of the SiGe mixed crystal regions 14A and 14B is conducted after the formation of the source/drain regions 11S and 11D. Thereby, desired operational characteristics are secured.

Meanwhile, in the step of FIG. 8D, it should be noted that, while the SiGe mixed crystal layers 14A and 14B have the thickness Y2 of 20-70 nm corresponding to the depth of the trenches 11TA and 11TB in the part located under the interface between the gate insulation film 12 and the silicon substrate 11, the epitaxial growth of the SiGe mixed crystal layers 14A and 14B is continued to the height Y1 of 0-30 nm beyond the foregoing interface. Here, it should be noted that, in the case the height Y1 is 0 nm, this means that the SiGe mixed crystal layers 14A and 14B are not grown beyond the interface between the gate insulation film 12 and the silicon substrate 11.

By growing the SiGe mixed crystal regions 14A and 14B beyond the interface between the gate insulation film 12 and the silicon substrate 11 in the process of FIG. 8D, it becomes possible to form the silicide layers 16A and 16B, which tend to accumulate a tensile stress therein, with large separation from the channel region, in which existence of compressive stress is desired. Thereby, it becomes possible to suppress the effect of canceling the uniaxial compressive stress, induced in the channel region by the SiGe mixed crystal regions 14A and 14B, by the tensile stress of the silicide films 16A and 16B. Thereby, it is preferable to control the salicide process for forming the silicide layers 16A and 16B such that the silicide layers 16A and 16B do not to reach the SiGe mixed crystal regions 14A and 14B across the cap layers 15A and 15B.

Figure 9:
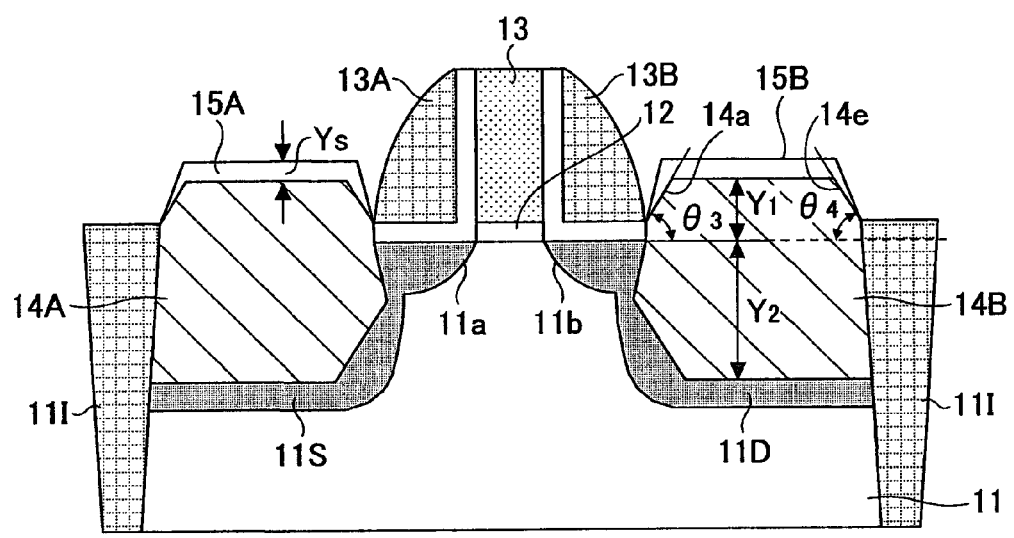
FIG. 9 is a diagram defining the parameters of the semiconductor device of FIG. 4D.

It should be noted in FIG. 9 that the part of the SiGe mixed crystal regions 14A and 14B grown beyond the interface of the gate insulation film 12 and the silicon substrate 11 has a side surface defined by the facet 14a at the side facing the channel region, while the side facing the device isolation structure 11I is defined by the facet 14e. Thereby, it is preferable that the facet 14a forms an angle θ3 of 40-90 degree and the facet 14b forms an angle θ4 of 40-60 degree.

Particularly, by setting the angle θ3 to 90 degrees or less, the silicide layers 16A and 16B on the cap layers 15A and 15B are not formed in contact with the sidewall insulation film 13A or 13B of the gate electrode 13, and it becomes possible to suppress the problems of occurrence short circuit through the silicide layers 16A and 16B or formation of parasitic capacitance between and gate electrode 13 and the silicide layer 16A or 16B.

Next, the relationship between the Ge concentration in the SiGe mixed crystal regions 14A and 14B formed with the process of FIG. 8D and the thicknesses Y1 and Y2 will be examined.

Generally, it is known that, when epitaxial growth is conducted in a strained system with the thickness exceeding a critical thickness, defects such as dislocations are induced in the epitaxial structure, and semiconductor layer of the quality suitable for use as the active region of a semiconductor device is not obtained.

On the other hand, as a result of the experimental investigations that constitute the foundation of the present invention, it was discovered that, in the case a SiGe mixed crystal layer is formed on the device region 11A of the semiconductor device with a limited area, there are cases in which the quality of the semiconductor layer thus grown and forming a strained system is not deteriorated even if the thickness of the semiconductor layer is increased beyond the so-called critical thickness, contrary to the model in which epitaxial growth is made continuously on a two-dimensional surface, and that there are also cases in which the quality of the semiconductor layer is not deteriorated even when the Ge concentration is increased beyond the critical concentration level, beyond which it has been thought that there would occur formation of defects such as dislocations. Further, it should be noted that this "effective" critical thickness increases with decreasing growth temperature, and thus, it becomes possible to induce the distortion in the channel region of the MOS transistor more effectively, by using the SiGe mixed crystal grown selectively in a localized area at a low temperature.

For example, it was confirmed that there occurs no degradation of crystal quality in the SiGe mixed crystal regions 14A and 14B when a SiGe film having the thickness Y1 of 20 nm and the thickness Y2 of 60 nm as defined in FIG. 9 has been used for the SiGe mixed crystal regions 14A and 14B, even when the Ge concentration level is increased up to the concentration level of 24% beyond the conventionally accepted limiting concentration level of 20%. In this experiment, it should be noted that the cap layers 15A and 15B of p-type Si have been grown epitaxially on the SiGe mixed crystal regions 14A and 14B with the thickness of 10 nm.

Further, it was confirmed that the epitaxial growth of the SiGe mixed crystal layers 14A and 14B is possible up to the atomic concentration level of Ge of about 40%.

Further, it was discovered that, in such a SiGe mixed crystal layer of high Ge concentration, there occurs increase in a solubility limit of B introduced as a p-type dopant and that it is possible to use a dopant concentration level of about $1 \times 10^{22}$ cm$^{-3}$. In the above experiment, the dopant concentration in the SiGe mixed crystal regions 14A and 14B is set to the range of $1 \times 10^{18}$-$1 \times 10^{21}$ cm$^{-3}$. On the other hand, the dopant concentration of B is set to about $1 \times 10^{18}$-$1 \times 10^{20}$ cm$^{-3}$ in the cap layers 15A and 15B characterized by low Ge concentration level.

Thus, with the present invention, it becomes possible to apply a larger uniaxial compressive stress to the channel region of the p-channel MOS transistor by increasing the Ge concentration in the SiGe mixed crystal regions 14A and 14B that act as the compression stressor.

Third Embodiment

Figures 10A, 10B, 10C:
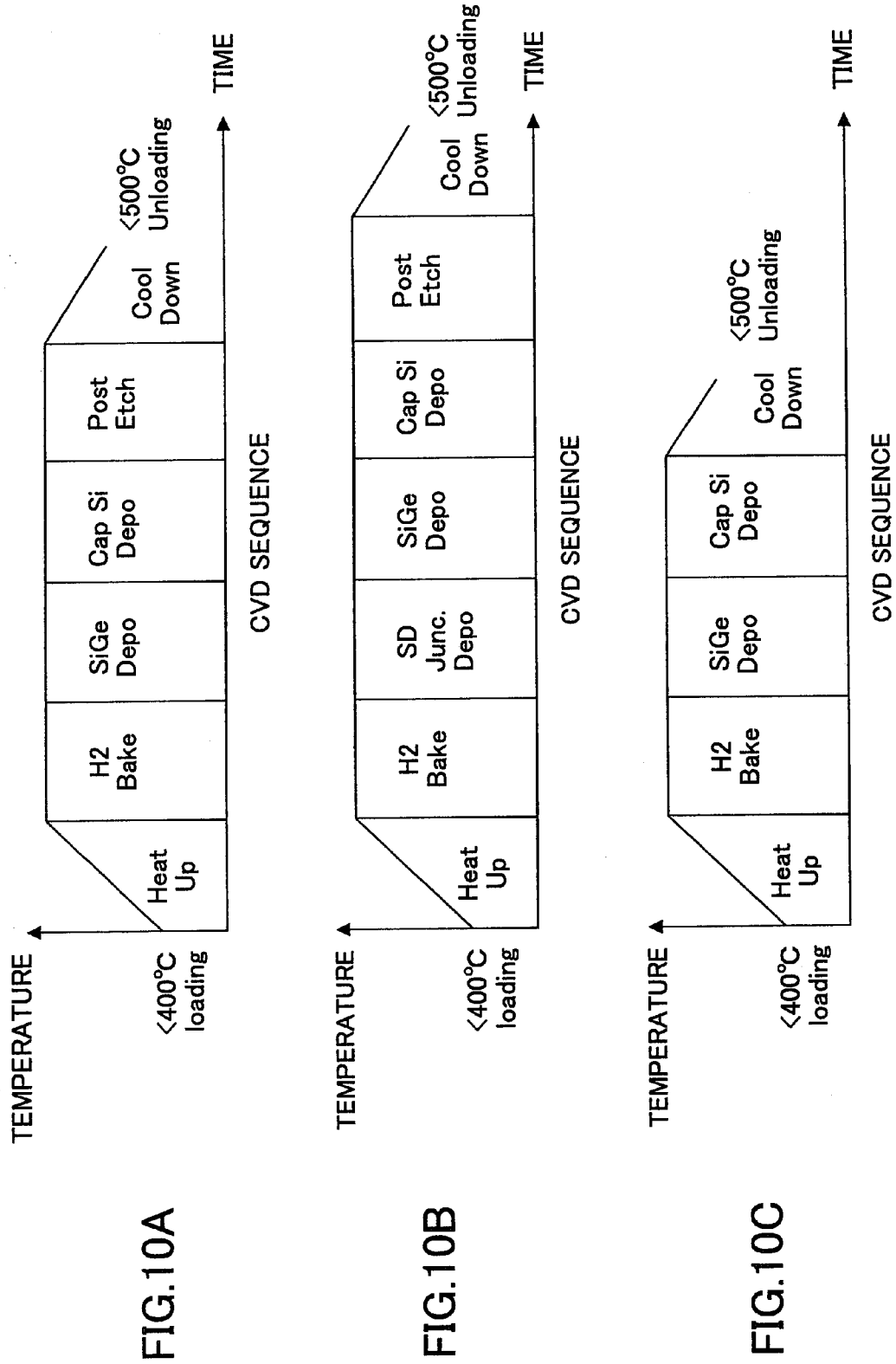
FIGS. 10A-10C are diagrams respectively showing various fabrication methods of the semiconductor devices according to a third embodiment of the present invention.

FIG. 10A is a diagram summarizing the process of FIG. 8D conducted in a low-pressure CVD apparatus explained above as a third embodiment the present invention.

Referring to FIG. 10A, a substrate to be processed is introduced into the low-pressure CVD apparatus at the temperature of 400° C. or lower at first, and the temperature is raised to a predetermined process temperature of 400-550° C. in a hydrogen ambient (HeatUp).

Thereafter, the substrate to be processed is held at the same process temperature in the same hydrogen ambient for the duration of 5 minutes in the maximum, and a hydrogen heat treatment process is conducted (H$_2$-Bake).

Subsequently, the processing gas introduced to the low-pressure CVD apparatus is changed at the same process temperature, and the epitaxial growth of the p-type SiGe mixed crystal regions 14A and 14B is conducted in the trenches 11TA and 11TB as explained previously (SiGe Depo).

Further, in the step of FIG. 10A, the composition or partial pressure of the processing gas introduced into the low-pressure CVD apparatus is changed subsequently to the epitaxial growth of the p-type SiGe mixed crystal regions 14A and 14B while maintaining the same process temperature of 400-550° C., and the cap layers 15A and 15B of p-type Si or p-type SiGe(C) mixed crystal are grown epitaxially on the SiGe mixed crystal regions 14A and 14B (Cap Si Depo).

Further, in the step of FIG. 10A, a hydrogen chloride gas is introduced, after formation of the cap layers 15A and 15B, into the low-pressure CVD apparatus in the inert or hydrogen ambient at the process temperature of 400-550° C. Thereby, any structure that can become the nuclei of silicide formation in the silicide formation process of FIG. 8E is removed from the sidewall insulation film 13A, 13B or the device isolation structure 11I (Post Etch), and the substrate temperature is subsequently lowered to 400° C. or lower (Cool Down) in the hydrogen or inert gas ambient.

Thus, with the process of FIG. 10A, it becomes possible to conduct the process steps from Heat Up to Cool Down efficiently and continuously in the low-pressure CVD apparatus without contamination, by eliminating the step of taking out the substrate to the atmosphere in the midway of the processing. Also, by conducting the processes from the H$_2$-Bake process to Post Etch process at the same substrate temperature, the process steps of changing the substrate temperature up and down is eliminated, and the overall process throughput is improved significantly.

FIG. 10B shows the process corresponding to the embodiment explained previously with reference to FIG. 9 in which the source region 11S and the drain region 11D are formed growing a p-type Si layer epitaxially after formation of the trenches 11TA and 11TB so as to cover the sidewall surface thereof.

Referring to FIG. 10B, the source region 11S and the drain region 11D can be formed in this case by introducing the silane gas and the diborane gas and the HCl gas into the low-pressure CVD apparatus with respective partial pressures of 1-10 Pa, $1 \times 10^{-4}$-$1 \times 10^{-2}$ Pa and 1-10 Pa, for example, after the foregoing H$_2$-Baking process, at the specified process temperature of 400-550° C.

Further, as shown in FIG. 10C, it is possible to omit the Post Etch process in the process of FIG. 10A according to the needs.

Fourth Embodiment

Figure 11:
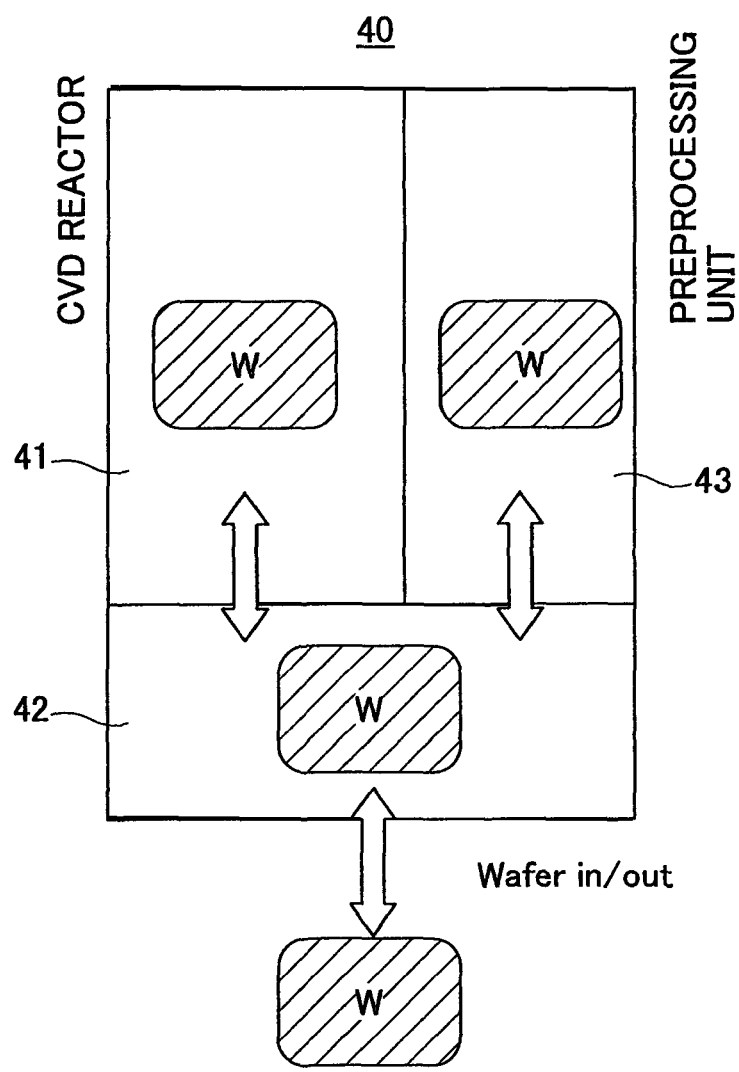
FIG. 11 is a diagram showing the growth method of a SiGe mixed crystal layer conducted by using a cluster-type substrate processing apparatus according to a fourth embodiment of the present invention.

FIG. 11 is a diagram showing the construction of the low-pressure CVD apparatus 40 used for the process of FIG. 8D or the process of FIGS. 10A-10C explained before.

Referring to FIG. 11, the low-pressure CVD apparatus 40 is a so-called cluster type substrate processing apparatus in which the CVD reaction furnace 41 for conducting the process steps of FIGS. 10A-10C are connected to a preprocessing chamber 43 via a substrate transportation chamber 42 filled with an inert gas such as a nitrogen gas, and the substrate W having the structure corresponding to the state of FIG. 10C is introduced into the substrate transportation chamber 42 via a gate valve not illustrated, wherein the substrate thus introduced is transported from the substrate transportation chamber 42 to the preprocessing chamber 43.

In the preprocessing chamber 43, a pre-processing for removing the native oxide film from the substrate surface is conducted by conducting a processing in a diluted hydrofluoric acid (DHF) and subsequent water rinse processing, or by a hydrogen radical cleaning processing, or alternatively by an HF gas phase processing.

The substrate finished with the pre-processing process is transported to the CVD reaction furnace 41 through the substrate transportation chamber 42 without being exposed to the air and the process steps of FIGS. 10A-10C are conducted.

Fifth Embodiment

In the p-channel MOS transistor explained previously, a thermal oxide film or an SiON film having a larger specific dielectric constant than a thermal oxide film is used frequently for the gate insulation film 12.

At the time of formation of such a gate oxide film 12, it is generally practiced to apply a heat treatment process to the surface of the silicon substrate 11 in a hydrogen ambient prior to the formation of the gate oxide film 12 for removing the native oxide film therefrom.

It should be noted that such a heat treatment process in the hydrogen ambient is carried out prior to the formation of the trenches 11TA and 11TB in the silicon substrate 11, in the state in which only the device isolation structure 11I is formed on the silicon substrate 11. Thereby, as a result that the native oxide film is removed completely from the surface of silicon substrate 11 with such a processing, pinning of the Si atoms on the substrate surface is eliminated, and it becomes possible for the Si atoms to migrate freely over the silicon substrate 11 outwardly in device region 11A defined by the device isolation structure 11I.

Figure 12A:
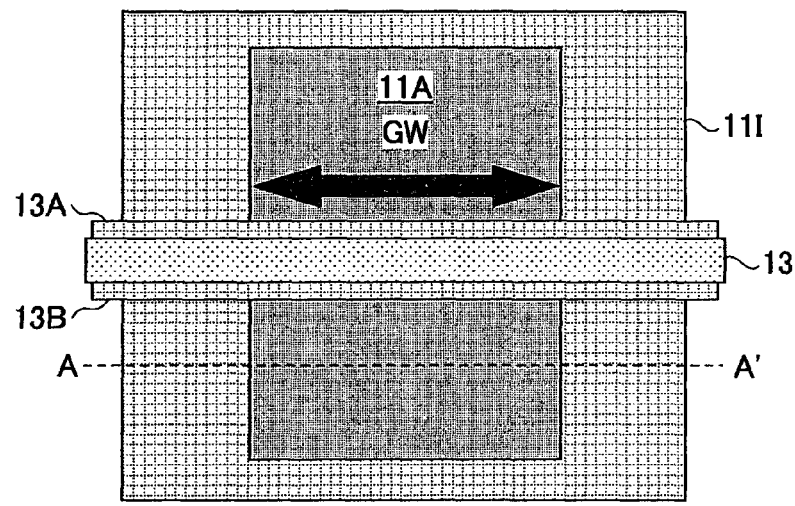
FIGS. 12A-12C are diagrams explaining the object of the present invention related to a fifth embodiment of the present invention.
Figure 12B:
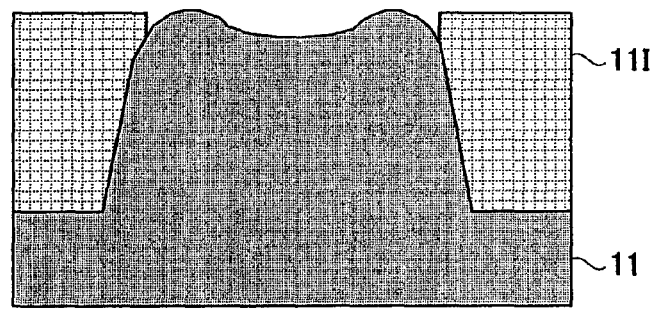
Figure 12C:
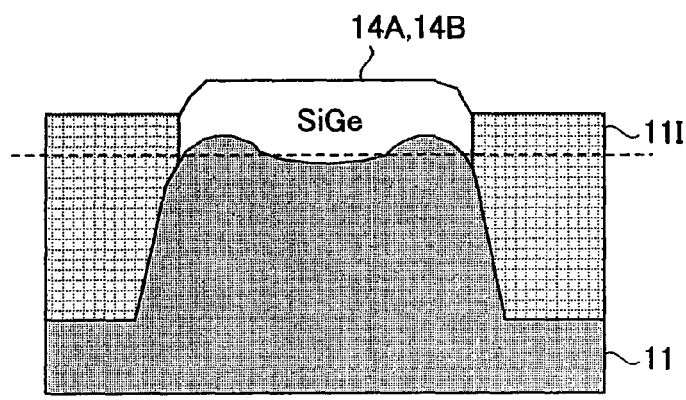

As a result of the free migration of the Si atoms over the surface of the silicon substrate 11, it should be noted that there is formed an undulation in the device region 11A as shown in FIGS. 12A-12C. Here, it should be noted that FIG. 12A is a plan view showing the part of the silicon substrate 11 including the device isolation region 11I and the device region 11A, while FIG. 12B is a cross-sectional view of FIG. 12A taken in the gate width direction. Further, FIG. 12C shows the structure of FIG. 12B in the state in which the trenches 11TA and 11TB are formed in the device region 11A and the trenches 11TA and 11TB thus formed are filled with the p-type SiGe mixed crystal regions 14A and 14B.

Referring to FIG. 12B, there is formed conspicuous undulation on the surface of the silicon substrate 11 in the device region 11A in the case the device region 11A has a relatively large gate width GW, wherein this undulation on the silicon substrate surface is transferred to the bottom part of the trenches 11TA and 11TB in the case the trenches 11TA and 11TB are formed as shown in FIG. 12C.

On the other hand, in the trenches 11TA and 11TB are filled with the SiGe mixed crystal regions 14A and 14B, there appears a flat surface at the top surface of the SiGe mixed crystal regions 14A and 14B due to the self limiting effect of the time of the crystal growth process.

Thus, in such a case, the SiGe mixed crystal regions are formed on the undulating bottom surface with a flat top surface. Thereby, increase and decrease of volume of the SiGe mixed crystal caused by undulation of the bottom surface is cancelled out at the level shown in FIG. 12C by the dotted line, and compressive stress similar to the one obtained for the case in which the SiGe mixed crystal regions are formed on a flat surface is obtained in the channel region.

Figure 13A:
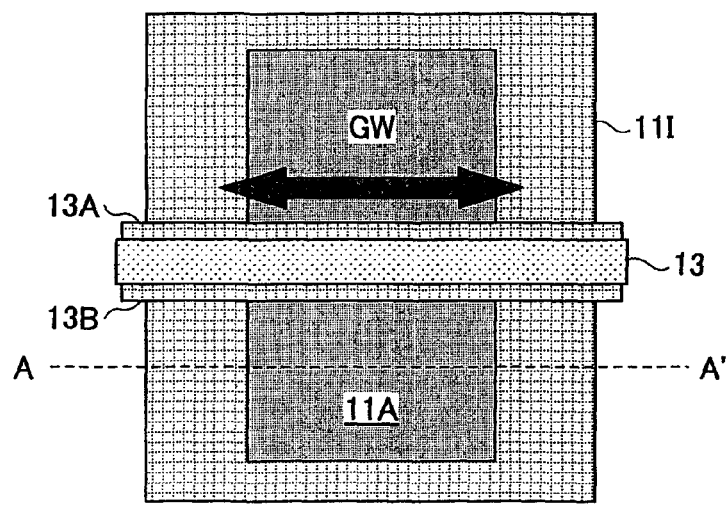
FIGS. 13A-13C are diagrams explaining the fifth embodiment of the present invention.
Figure 13B:
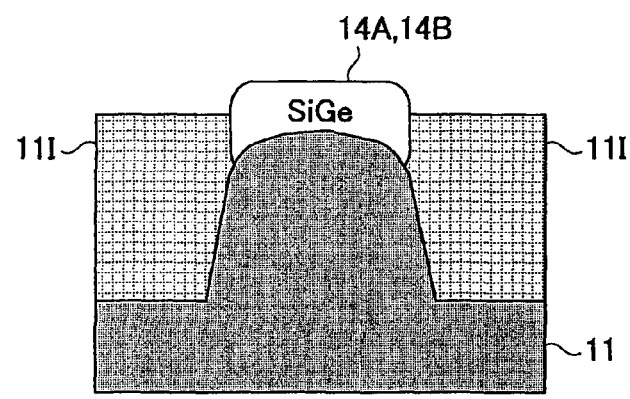

On the other hand, in the case the gate width GW is small, there appears only a convex surface on the surface of the device region 11A as it shown in FIGS. 13A and 13B, and thus, the effective volume of the SiGe mixed crystal regions 14A and 14B is decreased by the effect of the convex surface at the bottom surface in the case the trenches 11TA and 11TB are formed on the silicon substrate surface having such a convex surface and the trenches are filled with the SiGe mixed crystal regions 14A and 14B, in view of the flat surface of the SiGe mixed crystal regions 14A and 14B appearing as a result of the self-limiting effect. Thereby, the compression stress induced in the channel region is decreased substantially.

Thus, the present embodiment carries out the removal process of the native oxide, conducted immediately before formation of the gate insulation film 12 for removing the native oxide film from the silicon substrate surface, in an ambient not containing hydrogen, such as the ambient of nitrogen, Ar or He, for example, at the temperature that does not exceed 900° C.

Figure 13C:
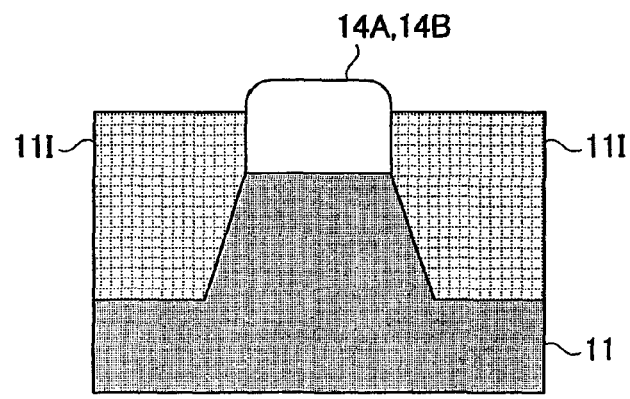

As a result of the native oxide removal process thus conducted at low temperature not containing hydrogen, formation of the convex surface at the bottom surface of the trenches 11A and 11B is suppressed as shown in FIG. 13C, and decrease of effective volume of the SiGe mixed crystal regions 14A and 14B filling the trenches 11A and 11B is avoided. Thus, it becomes possible to induce a large uniaxial compressive stress in the channel region with the construction of the present embodiment.

Sixth Embodiment

Meanwhile, in the process of FIG. 8D, there is inevitably caused a deposition of SiGe mixed crystal on the surface of the polysilicon gate electrode 13 at the time of filling the trenches 11TA and 11TB by the SiGe mixed crystal regions 14A and 14B, when the surface of the polysilicon gate electrode 13 is exposed.

Figure 14A:
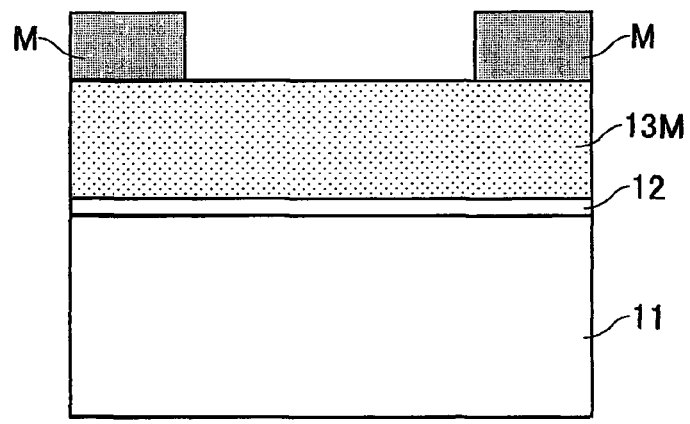
FIGS. 14A-14C are diagrams explaining a sixth embodiment of the present invention.

Thus, with the process of FIG. 8D, a mask M is formed on a polysilicon film 13M used for forming the polysilicon gate electrode 13 in correspondence to the polysilicon gate electrode 13 at the time of forming the polysilicon gate electrode 13, by using a silicon oxide film or silicon nitride film as shown in FIG. 14A.

Figure 14B:
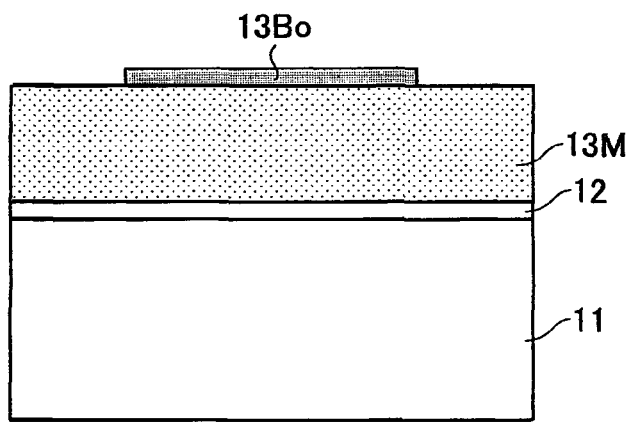

Next, in the step of FIG. 14B, the structure of FIG. 14A is exposed to a hydrogen/diborane gas mixture ambient at the temperature of 300-550° C., to form a B (boron) film 13Bo on the polysilicon film 13M in correspondence to the region where the gate electrode 13 is formed with the thickness of 1-10 nm.

Figure 14C:
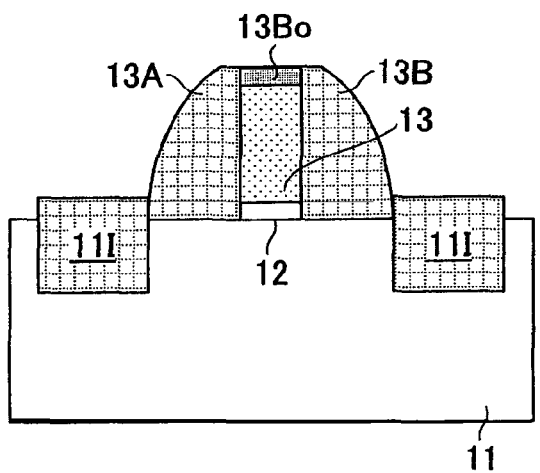

Next, in the process of FIG. 14C, the polysilicon film 13M is pattered to form the gate electrode 13 and the sidewall insulation films 13A and 13B are formed. In FIG. 14C, it should be noted that representation of the CVD oxide film 12I is omitted. In the structure of FIG. 14C, it should be toned that the boron mask pattern 13Bo is formed on the top part of the polysilicon gate electrode 13.

Because there occurs no growth of the SiGe layer on such a boron mask pattern 13Bo, there occurs no growth of the SiGe mixed crystal layer on the polysilicon gate electrode 13 even when the SiGe mixed crystal regions 14A and 14B are grown in the trenches 11TA and 11TB in the step of FIG. 8D.

Further, it is also possible to dope the part of the polysilicon film 13M forming the polysilicon gate electrode 13 selectively to p-type in the step of FIG. 14B.

Further, the present invention is not limited to the embodiments described heretofore, but various variations and modifications may be made without departing from the scope of the invention.

What is claimed is:

1. A semiconductor device comprising:
   a silicon substrate;
   a gate insulating film over the silicon substrate;
   a gate electrode formed over the gate insulating film;
   a source region and a drain region formed in the silicon substrate;
   a first SiGe mixed crystal region formed in the source region, a bottom of said first SiGe mixed crystal region being located shallower than a bottom of said source region;
   a second SiGe mixed crystal region formed in the drain region, a bottom of said second SiGe mixed crystal region being located shallower than a bottom of said drain region;
   a first silicide layer over the first SiGe mixed crystal region; and
   a second silicide layer over the second SiGe mixed crystal region,
   wherein a bottom of the first silicide layer and a bottom of the second silicide layer are located higher than a first boundary between the silicon substrate and the gate insulating film,
   wherein each of said first and second SiGe mixed crystal regions is defined by a plurality of facets forming respective, mutually different angles with respect to a surface of said substrate under the gate insulating film.

2. The semiconductor device according to claim 1, further comprising:
   a third SiGe mixed crystal region between the first silicide layer and the first SiGe mixed crystal region; and
   a fourth SiGe mixed crystal region between the second silicide layer and the second SiGe mixed crystal region,
   wherein a Ge concentration of the third SiGe mixed crystal region is less than a Ge concentration of the first SiGe mixed crystal region, and a Ge concentration of the fourth SiGe mixed crystal region is less than a Ge concentration of the second SiGe mixed crystal region.

3. The semiconductor device according to claim 2,
   wherein both the Ge concentration of the third SiGe mixed crystal region and the Ge concentration of the fourth SiGe mixed crystal region are 0 atom % to 20 atom %.

4. The semiconductor device according to claim 1, wherein the first SiGe mixed crystal region and the second SiGe mixed crystal region are crystal layers formed by epitaxial growth.

5. The semiconductor device according to claim 1,
   further comprising:
   a sidewall insulating film formed on side wall of the gate electrode.

6. The semiconductor device according to claim 5, wherein a second boundary between the first SiGe mixed crystal region and the silicon substrate includes at least one facet, and a third boundary between the second SiGe mixed crystal region and the silicon substrate includes at least one facet.

7. The semiconductor device according to claim 1,
   wherein said plurality of facets include a main facet and a lower facet continuing to said main facet at a lower side of said main facet, such that a distance between mutually facing main facets of said first and second SiGe mixed crystal regions decreases in a downward direction of said silicon substrate, and such that a distance between mutually facing lower facets of said first and second SiGe mixed crystal regions increases in said lower direction of said silicon substrate in continuation with said respective main facets.

* * * * *